United States Patent
Read

(10) Patent No.: US 9,381,529 B2
(45) Date of Patent: Jul. 5, 2016

(54) SYSTEMS, DEVICES AND METHODS RELATED TO PAINT RECIRCULATION DURING MANUFACTURE OF RADIO-FREQUENCY MODULES

(71) Applicant: SKYWORKS SOLUTIONS, INC., Woburn, MA (US)

(72) Inventor: Matthew Sean Read, Rancho Santa Margarita, CA (US)

( * ) Notice: Subject to any disclaimer, the term of this patent is extended or adjusted under 35 U.S.C. 154(b) by 0 days.

(21) Appl. No.: 14/023,841

(22) Filed: Sep. 11, 2013

(65) Prior Publication Data

US 2014/0072705 A1    Mar. 13, 2014

Related U.S. Application Data

(60) Provisional application No. 61/700,394, filed on Sep. 13, 2012, provisional application No. 61/700,398, filed on Sep. 13, 2012.

(51) Int. Cl.
*B05B 9/04* (2006.01)
*H05K 1/02* (2006.01)
*B05B 12/08* (2006.01)
(Continued)

(52) U.S. Cl.
CPC .............. *B05B 9/042* (2013.01); *B05B 7/2427* (2013.01); *B05B 12/081* (2013.01); *H05K 1/0218* (2013.01); *H05K 3/284* (2013.01); *H05K 2201/0715* (2013.01);
(Continued)

(58) Field of Classification Search
USPC ........................................................ 239/127
See application file for complete search history.

(56) References Cited

U.S. PATENT DOCUMENTS

| 3,317,141 A | 5/1967 | Mann |
| 4,979,380 A | 12/1990 | Robbins |

(Continued)

FOREIGN PATENT DOCUMENTS

| JP | 2006-116955 A | 5/2006 |
| JP | 2008-266761 A | 11/2008 |
| JP | 2011-255580 A | 12/2011 |

OTHER PUBLICATIONS

International Search Report and Written Opinion issued on Jan. 20, 2014 in connection with corresponding PCT Application No. PCT/US2013/059156.

(Continued)

*Primary Examiner* — Nathan T Leong
(74) *Attorney, Agent, or Firm* — Chang & Hale LLP; James Chang; Tony T. Chen

(57) ABSTRACT

In applications such as manufacture of shielded radio-frequency modules where costly metallic paint is sprayed to form a conductive layer, it is desirable to reduce the amount of paint being utilized, and to maintain an acceptable level of suspension of paint particles in solution. A closed recirculation system can be configured to provide such desirable features, and can include a reservoir for holding a volume of metallic paint, a spray apparatus for spraying metallic paint received from the reservoir, and a recirculator for recirculating the metallic paint that is not sprayed back to the reservoir. In some embodiments, the recirculator can include a compact peristaltic pump that allows use of shorter fluid paths in the closed recirculation system, as well as a desired level of agitation to quickly achieve the acceptable level of suspension and maintain the suspension for an extended period of time.

16 Claims, 26 Drawing Sheets

(51) Int. Cl.
*B05B 7/24* (2006.01)
*H05K 3/28* (2006.01)

(52) U.S. Cl.
CPC . *H05K 2203/049* (2013.01); *H05K 2203/1344* (2013.01); *H05K 2203/1366* (2013.01)

(56) References Cited

U.S. PATENT DOCUMENTS

| | | | |
|---|---|---|---|
| 5,458,289 A | 10/1995 | Cater | |
| 6,036,107 A * | 3/2000 | Aspen | A01M 7/0089 137/883 |
| 2006/0290877 A1* | 12/2006 | Jeon et al. | 349/187 |
| 2008/0173728 A1* | 7/2008 | Ilfrey | 239/74 |
| 2012/0138471 A1 | 6/2012 | Mayer et al. | |

OTHER PUBLICATIONS

Non-Final Office Action for U.S. Appl. No. 14/023,850 dated Sep. 11, 2015.

* cited by examiner

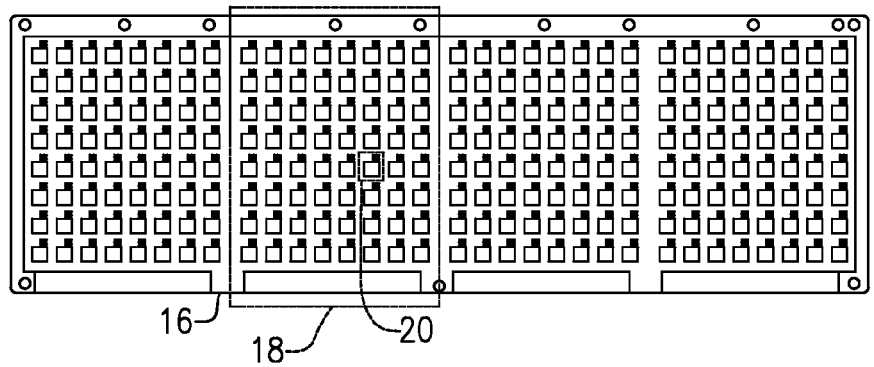
FIG.2A1
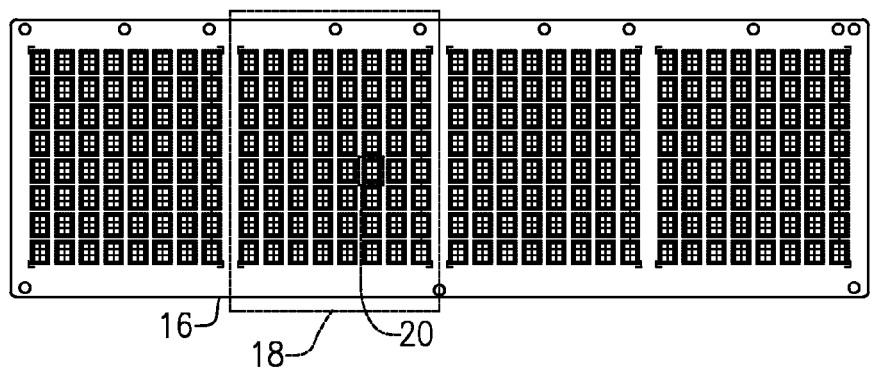
FIG.2A2

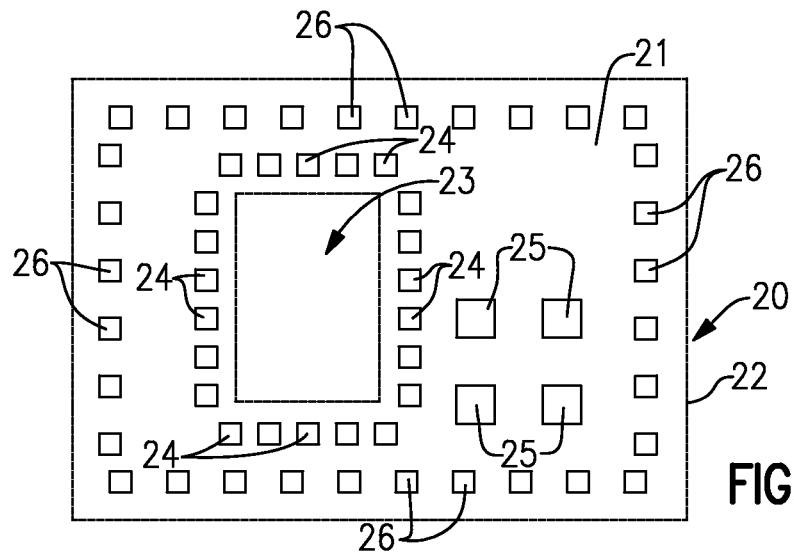
FIG.2B1
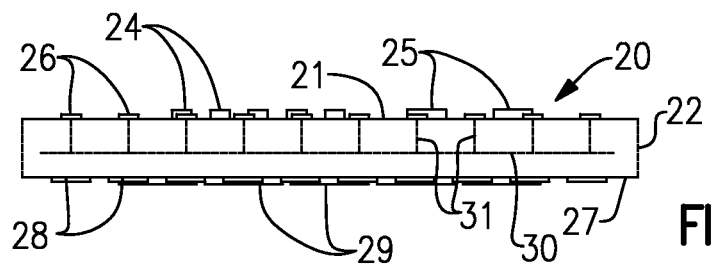
FIG.2B2
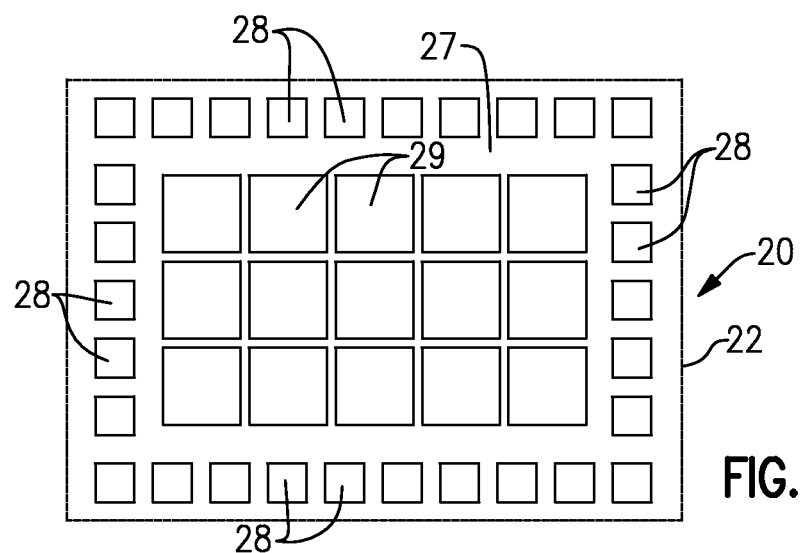
FIG.2B3

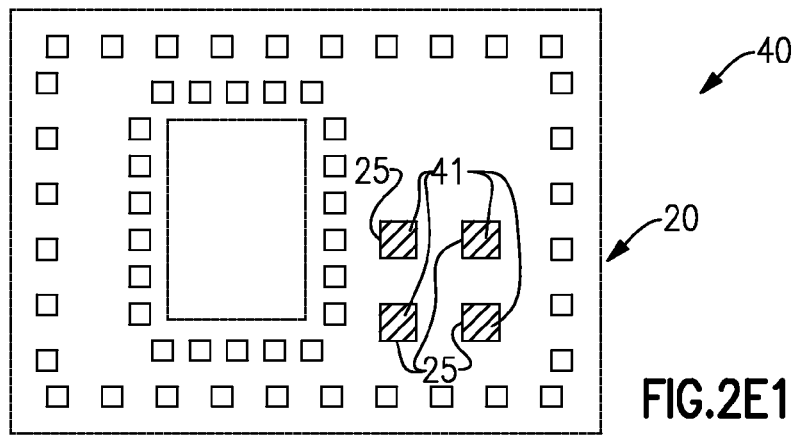
FIG.2E1
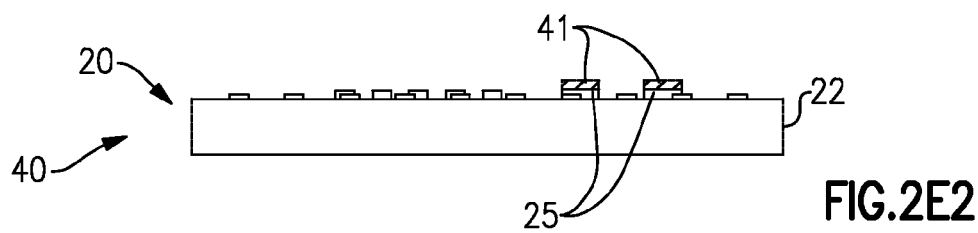
FIG.2E2
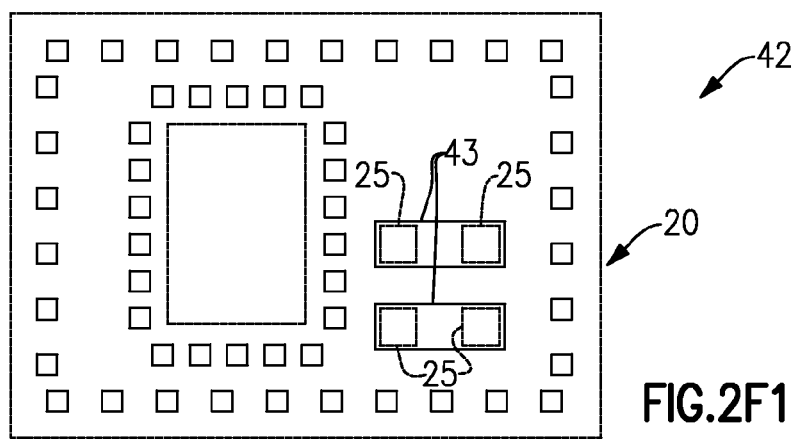
FIG.2F1
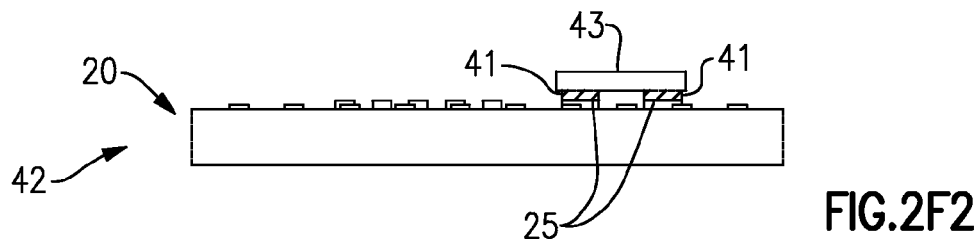
FIG.2F2

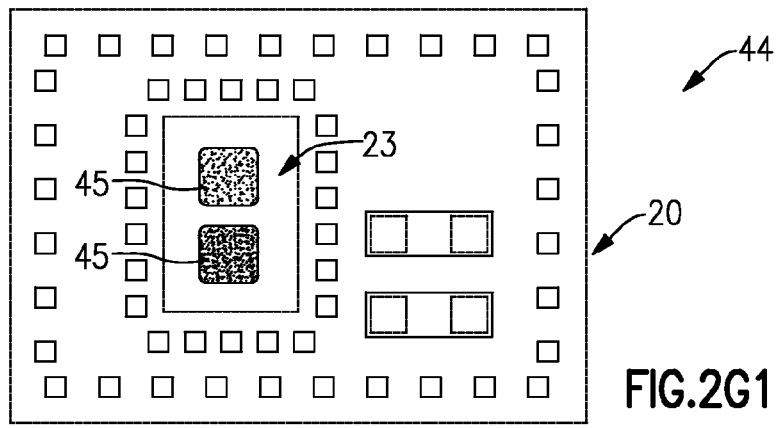
FIG.2G1
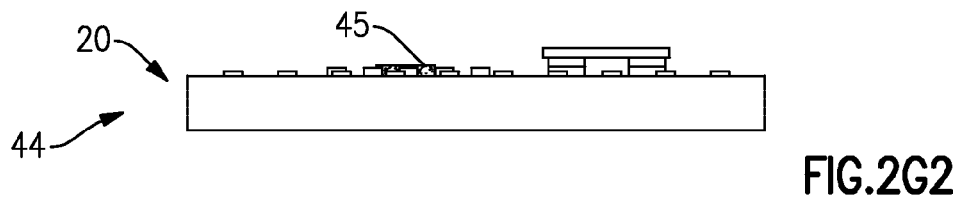
FIG.2G2
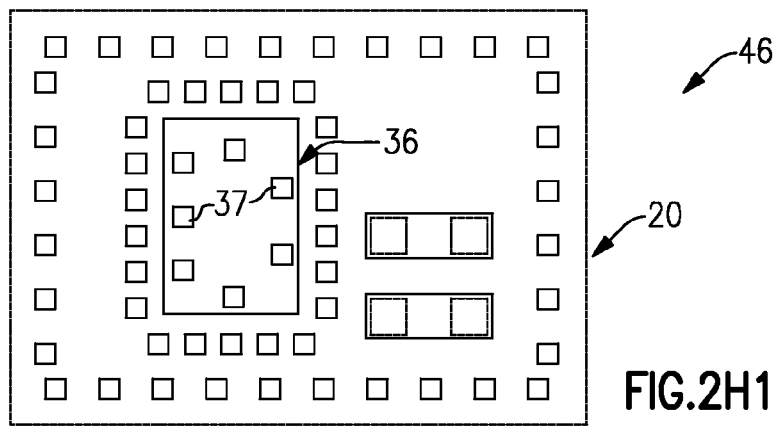
FIG.2H1
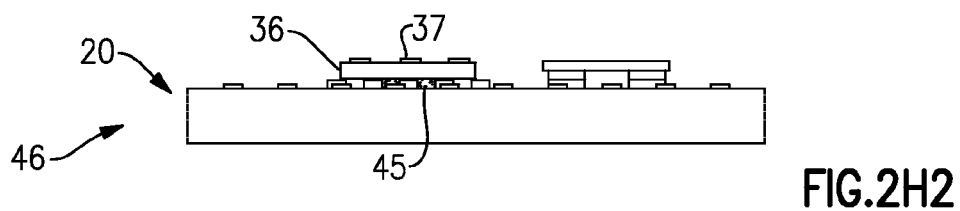
FIG.2H2

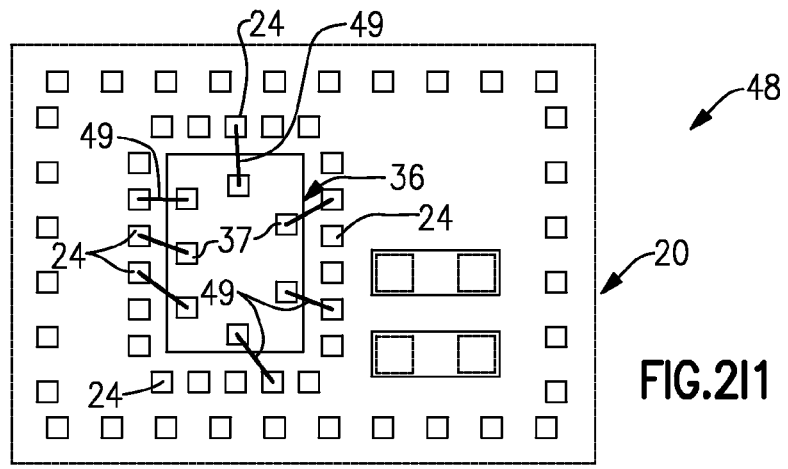
FIG. 2I1
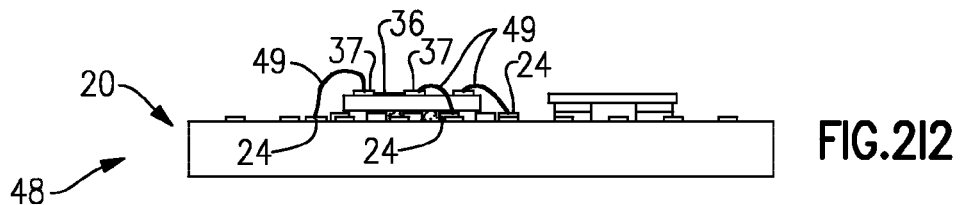
FIG. 2I2
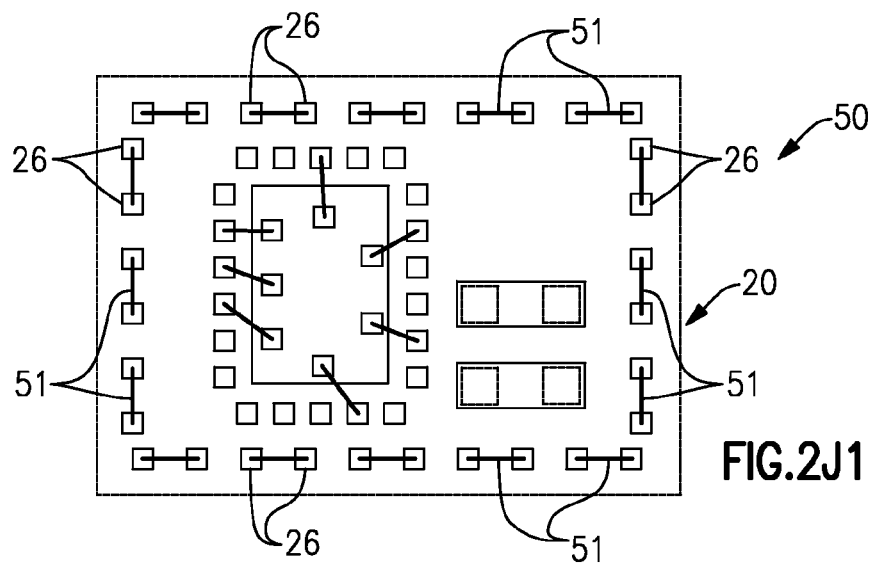
FIG. 2J1
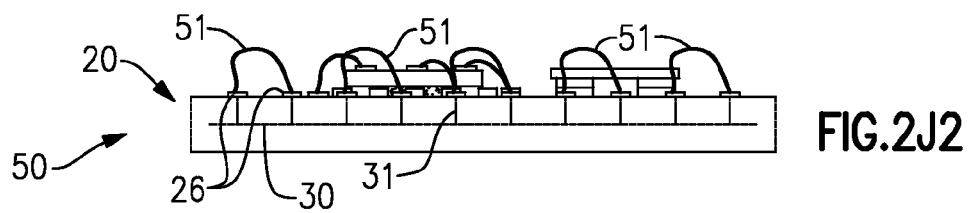
FIG. 2J2

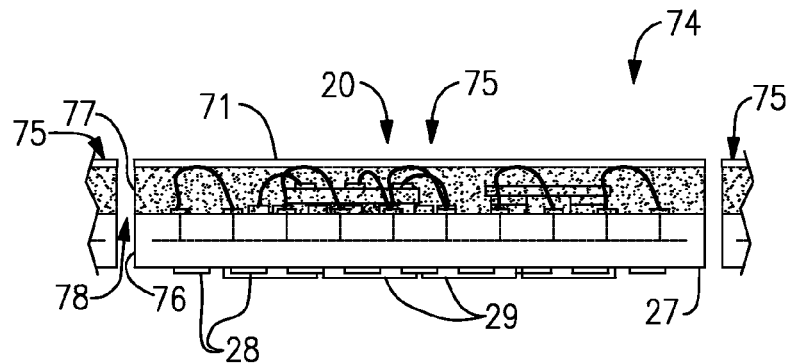
FIG.2R
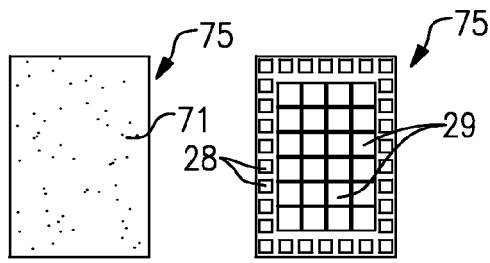
FIG.2S1  FIG.2S2
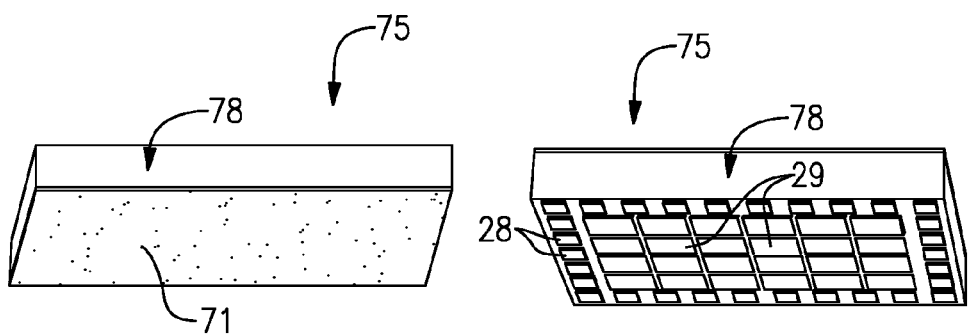
FIG.2S3

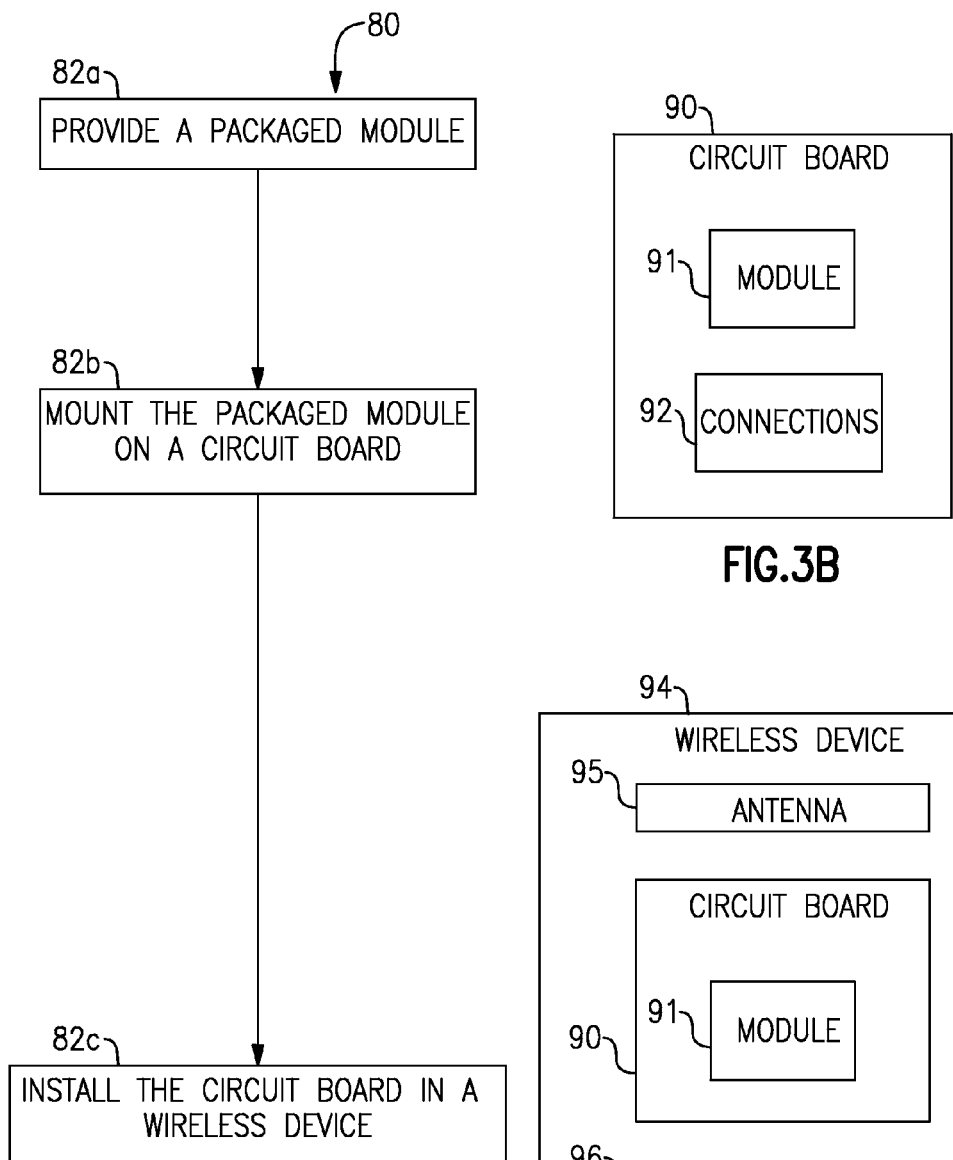

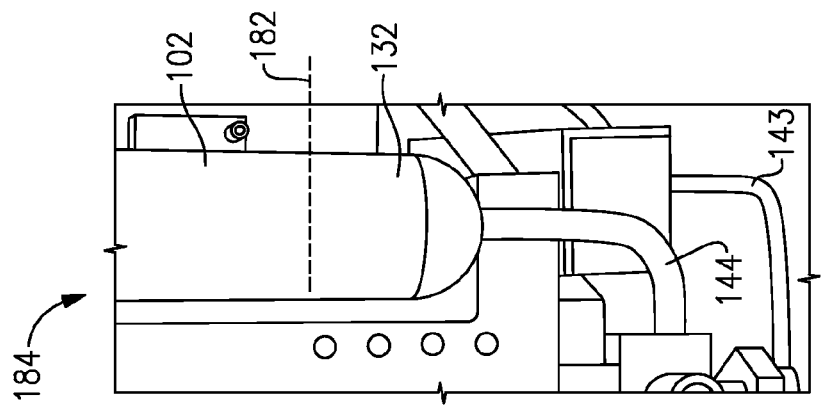
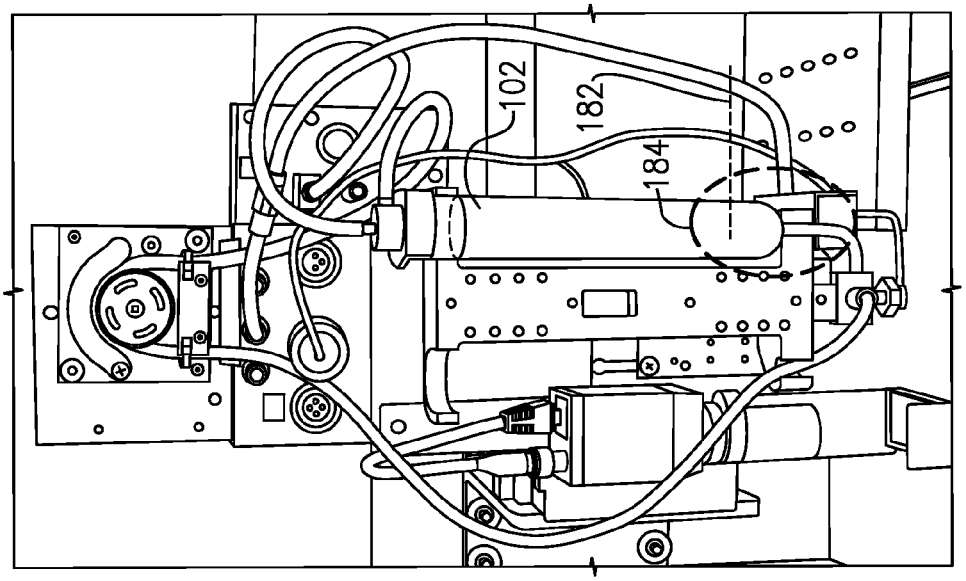
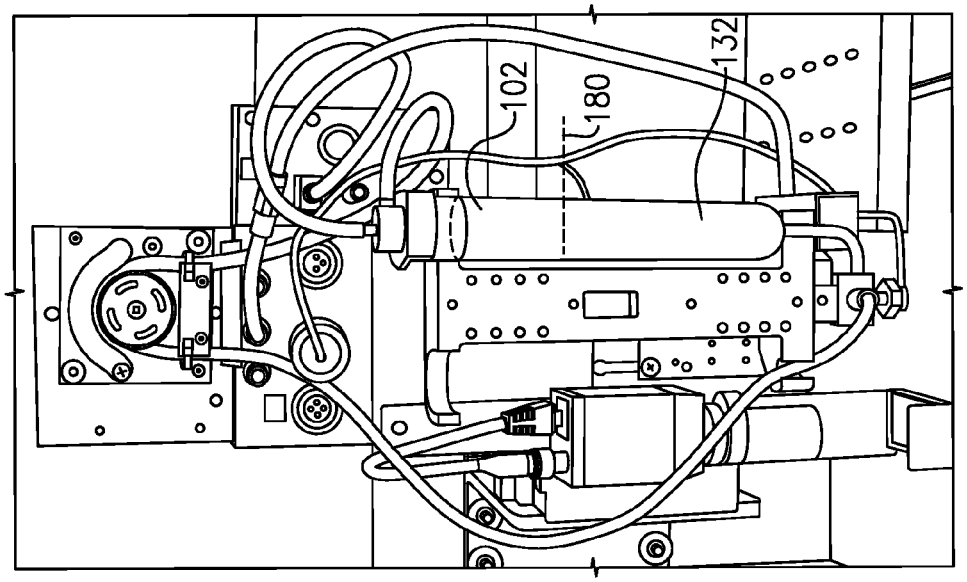
FIG. 8C
FIG. 8B
FIG. 8A

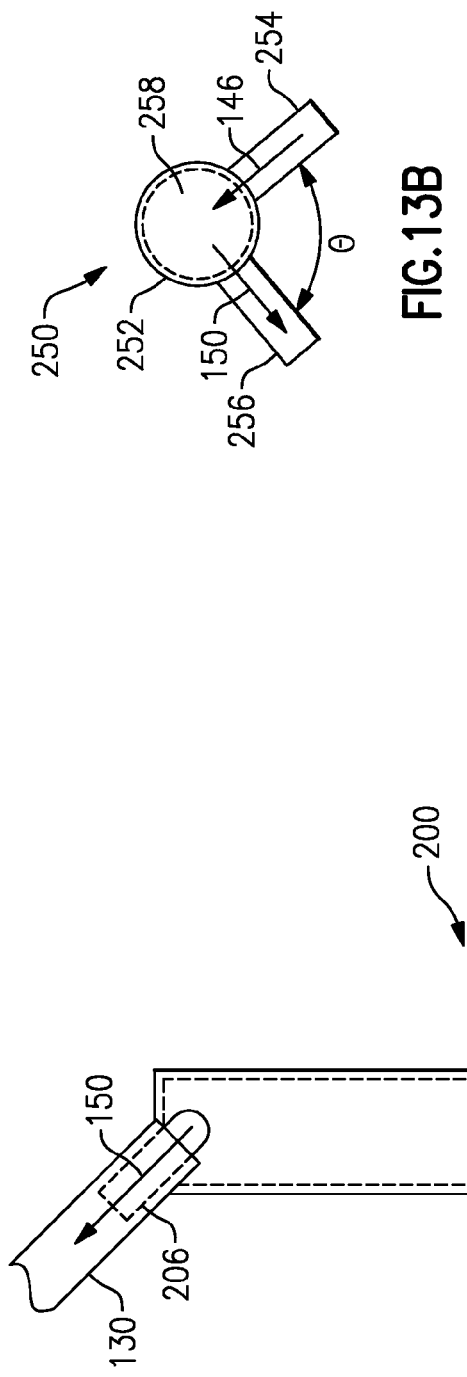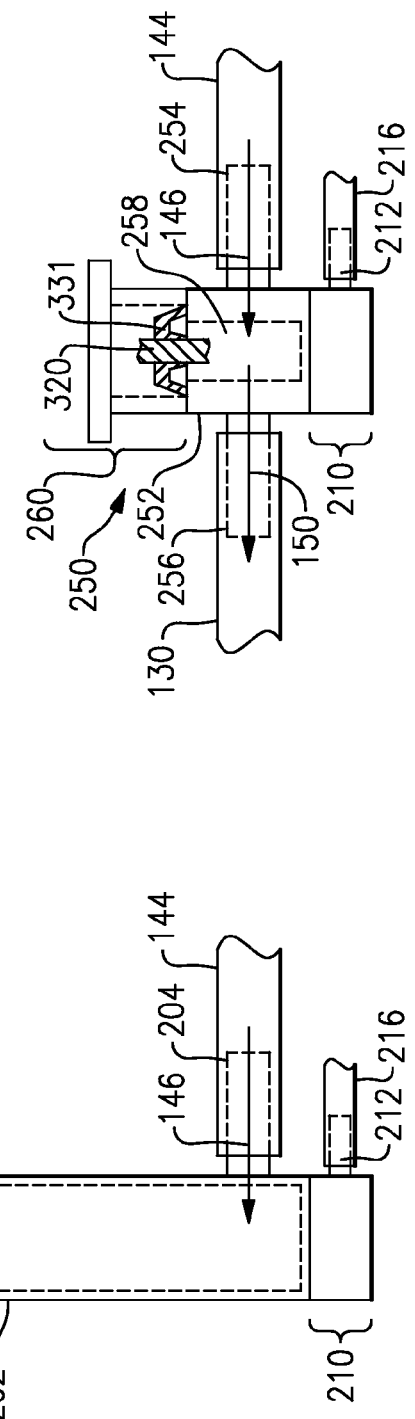

RECIRCULATE MODE

SPRAY MODE

SYSTEMS, DEVICES AND METHODS RELATED TO PAINT RECIRCULATION DURING MANUFACTURE OF RADIO-FREQUENCY MODULES

CROSS-REFERENCE TO RELATED APPLICATIONS

This application claims priority to U.S. Provisional Application Nos. 61/700,394 filed Sep. 13, 2012 and entitled "SYSTEMS AND METHODS RELATED TO PAINT RECIRCULATION," and 61/700,398 filed Sep. 13, 2012 and entitled "SYSTEMS AND METHODS RELATED TO SPRAY-PAINTING FLUID PATH," each of which is expressly incorporated by reference herein in its entirety.

BACKGROUND

1. Field

The present disclosure generally relates to systems, devices and methods related to paint delivery and recirculation during manufacture of radio-frequency modules.

2. Description of the Related Art

In some applications involving packaging of radio-frequency (RF) modules, an array of such modules can be fabricated in an array on a panel. An overmold structure can be formed on the panel to encapsulate various components of the modules. A conductive layer such as metallic paint can be formed on a surface of such an overmold structure. Such a conductive layer, in conjunction with RF shielding structures such as shielding wirebonds and a ground plane, can provide effective shielding functionality for the modules.

SUMMARY

According to a number of implementations, the present disclosure relates to a painting system for fabricating electronic modules. The system includes a reservoir having an input and an output, with the reservoir being implemented to hold a volume of metallic paint. The system further includes a recirculator coupled to the reservoir and implemented to receive metallic paint that has left the output of the reservoir and pump the metallic paint back to the input of the reservoir by peristalsis action to agitate the volume of metallic paint in the reservoir.

In some embodiments, the system can further include a spray apparatus implemented between the output of the reservoir and the recirculator. The spray apparatus can include a nozzle assembly configured to be capable of spraying the metallic paint. The spray apparatus can include a selector configured to route the metallic paint to either the nozzle assembly for spraying of the metallic paint or the recirculator for pumping the metallic paint back to the reservoir. The selector can include a seal mechanism.

In some embodiments, the recirculator can include a peristaltic pump. The peristaltic pump can be a rotary-type peristaltic pump. The peristaltic pump can be configured to operate at different speeds to yield different flow rates.

In some embodiments, a recirculating path defined by a path from the reservoir to the spray apparatus, a path from the spray apparatus to the peristaltic pump, and a path from the peristaltic pump to the reservoir, can be substantially closed to inhibit vaporization loss. The recirculating path can have a length that is less than approximately 30 inches to reduce a purging volume. The length can be less than approximately 15 inches.

In some embodiments, a relatively compact size of the peristaltic pump can allow the spray apparatus and the reservoir to be positioned relatively close to the peristaltic pump, thereby allowing a relatively short length for the recirculating path. In some embodiments, each of the path from the spray apparatus to the peristaltic pump and the path from the peristaltic pump to the reservoir can include a tubing having a bore diameter selected to yield a desired flow rate of the recirculating path. An increase in the bore diameter can result in an increase in the flow rate.

In some embodiments, the reservoir can further include a gas input configured to receive a pressurized gas to push the metallic paint from the reservoir to the spray apparatus.

In some embodiments, the system can be capable of establishing a desired level of suspension for the metallic paint from a separated state within approximately 5 minutes. The system can be capable of substantially maintaining the desired level of suspension for at least 9 hours, and in some situations, for at least 12 hours.

In a number of implementations, the present disclosure relates to a recirculating system for agitating metallic paint awaiting spray-application to form a conductive layer for one or more electronic modules. The system includes a peristaltic pump configured to pump the metallic paint from a reservoir and return unsprayed metallic paint to the reservoir.

In accordance with some teachings, the present disclosure relates to a method for agitating metallic paint. The method includes providing metallic paint in a reservoir. The method further includes pumping the metallic paint from the reservoir by peristalsis action. The method further includes returning the pumped metallic paint back to the reservoir so that the returned metallic paint has a desired level of suspension of metal particles in a solvent of the metallic paint.

In some implementations, the present disclosure relates to a method for applying metallic paint during fabrication of electronic modules. The method includes providing a reservoir to hold a volume of metallic paint awaiting spray-application, with the reservoir including an input and an output. The method further includes providing a spray apparatus capable of being in a spray mode and a recirculate mode. The method further includes providing the metallic paint from the reservoir to the spray apparatus through a first path to allow spray-application of the metallic paint when the spray apparatus is in the spray mode. The method further includes returning the metallic paint from the spray apparatus to the reservoir through a second path by peristalsis when the spray apparatus is in the recirculate mode.

According to some implementations, the present disclosure relates to a painting system for fabricating electronic modules. The system includes a reservoir implemented to hold a volume of metallic paint. The system further includes a spray apparatus coupled to the reservoir. The spray apparatus includes a chamber that defines an input port implemented to receive metallic paint from the reservoir, an output port implemented to allow spray-application of the metallic paint when in a spray mode, and a return port implemented to allow return of the metallic paint back to the reservoir when not in the spray mode. The input port and the return port are positioned at a substantially common height in the chamber to accommodate a reduced vertical dimension of the chamber and to promote a desired flow of the metallic paint between the input port and the return port.

In some embodiments, the system can further include a recirculator coupled to the return port of the chamber and implemented to recirculate the metallic paint back to the reservoir. The recirculator can include a peristaltic pump.

In some embodiments, the spray apparatus can further include a selector implemented to allow the spray apparatus to switch between the spray and recirculate modes. The selector can include a sealing mechanism. The chamber can have a cylindrical shape such that the output port is positioned on a floor of the cylinder and each of the input and port and the return port is defined on a wall of the cylinder. The substantially common height of the input port and the return port can allow the cylinder to have a reduced or minimum height. The sealing mechanism such as a U-cup seal can be positioned at a ceiling of the cylinder. The reduced or minimum height of the cylinder can allow the sealing mechanism to be positioned closer to the output port to thereby reduce the amount of features where flakes from the metallic paint are likely to accumulate.

In some embodiments, the spray apparatus can further include a nozzle assembly implemented to receive the metallic paint through the output port and generate an output spray. The nozzle assembly can include a gas port for receiving pressurized gas to facilitate atomization of the output spray.

In accordance with a number of implementations, the present disclosure relates to a chamber for a spray apparatus. The chamber includes an input port implemented to allow receiving of paint having a relatively quick settling property. The chamber further includes an output port implemented to allow spray-application of the paint from the chamber. The chamber further includes a return port implemented to allow removal of the paint that is not sprayed. The return port is positioned relative to the input port to reduce the volume of the chamber and to reduce the likelihood of accumulation of paint particles within the chamber.

In some embodiments, the paint particles can include metallic flakes. In some embodiments, the chamber can define a cylindrical volume, with the output port being positioned at a floor of the cylindrical volume, and the input and return ports being positioned at a side wall of the cylindrical volume. The input and return ports can be positioned at approximately the same height from the floor to thereby allow reduction of minimization of a length of the cylindrical volume. The input and return ports can be positioned so that an azimuthal angle between the input port and the return port is in a range of approximately 60 to 120 degrees. For example, the azimuthal angle between the input port and the return port can be approximately 90 degrees.

According to some implementations, the present disclosure relates to a spray apparatus that includes a chamber configured to receive paint. The chamber includes a first cap, a second cap, and a side wall between the first cap and the second cap. The spray apparatus further includes an input port defined by the side wall of the chamber, with the input port being configured to provide an input path for the paint. The spray apparatus further includes a return port defined by the side wall of the chamber, with the return port being configured to provide a recirculation exit path for the paint. The input port and the return port can be positioned at approximately the same distance from the first cap. The spray apparatus further includes an output port defined by the first cap. The output port is configured to provide a spray exit path for the paint, and includes a valve seating surface. The spray apparatus further includes a valve pin having a tip dimensioned to mate with the valve seating surface of the output port to substantially seal the output port when the spray apparatus is in a recirculation mode. The valve pin is configured to retract away from the valve seating surface to open the output port when the spray apparatus is in a spray mode.

In some embodiments, the valve pin can extend through the second cap. The valve pin can include an air piston configured to receive pressurized air to allow the valve pin to be retracted. The spray apparatus can further include a return spring assembly coupled to the valve pin. The return spring assembly can be configured to allow the valve pin to return to the seated position when the application of pressurized air ceases. The second cap can include a seal configured to allow the retracting and return motions of the valve pin while inhibiting passage of paint from the chamber through the second cap. The spray apparatus can further include an adjustment device coupled to the valve pin. The adjustment device can be configured to adjust a travel distance of the retracting motion of the valve pin.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 14/023,850, titled "SYSTEMS, DEVICES AND METHODS RELATED TO SPRAY-PAINTING FLUID PATH FOR MANUFACTURE OF RADIO-FREQUENCY MODULES," filed on even date herewith and hereby incorporated by reference herein in its entirety.

BRIEF DESCRIPTION OF THE DRAWINGS

FIGS. 2A1 and 2A2 show front and back sides of an example laminate panel configured to receive a plurality of dies for formation of packaged modules.

FIGS. 2B1 to 2B3 show various views of a laminate substrate of the panel configured to yield an individual module.

FIGS. 2E1 and 2E2 show various views of the laminate substrate being prepared for mounting of example surface-mount technology (SMT) devices.

FIGS. 2F1 and 2F2 show various views of the example SMT devices mounted on the laminate substrate.

FIGS. 2G1 and 2G2 show various views of the laminate substrate being prepared for mounting of an example die.

FIGS. 2H1 and 2H2 show various views of the example die mounted on the laminate substrate.

FIGS. 2I1 and 2I2 show various views of the die electrically connected to the laminate substrate by example wirebonds.

FIGS. 2J1 and 2J2 show various views of wirebonds formed on the laminate substrate and configured to facilitate electromagnetic (EM) isolation between an area defined by the wirebonds and areas outside of the wirebonds.

FIG. 2R shows individual packaged modules being cut from the panel.

FIGS. 2S1 to 2S3 show various views of an individual packaged module.

FIG. 3A shows a process that can be implemented to install a packaged module having one or more features as described herein on the circuit board of FIG. 2T.

FIG. 3B schematically depicts the circuit board with the packaged module installed thereon.

FIG. 3C schematically depicts a wireless device having the circuit board with the packaged module installed thereon.

FIGS. 8A-8C show an example of how the recirculating apparatus can maintain a desired suspension of particles over time during operation.

FIG. 12 schematically depicts the spray apparatus of FIG. 10.

FIGS. 13A and 13B schematically depict the spray apparatus of FIG. 11.

DETAILED DESCRIPTION OF SOME EMBODIMENTS

The headings provided herein, if any, are for convenience only and do not necessarily affect the scope or meaning of the claimed invention.

Described herein are various examples of systems, apparatus, devices structures, materials and/or methods related to fabrication of packaged modules having a radio-frequency (RF) circuit and wirebond-based electromagnetic (EM) isolation structures. Although described in the context of RF circuits, one or more features described herein can also be utilized in packaging applications involving non-RF components. Similarly, one or more features described herein can also be utilized in packaging applications without the EM isolation functionality.

Figure 1:
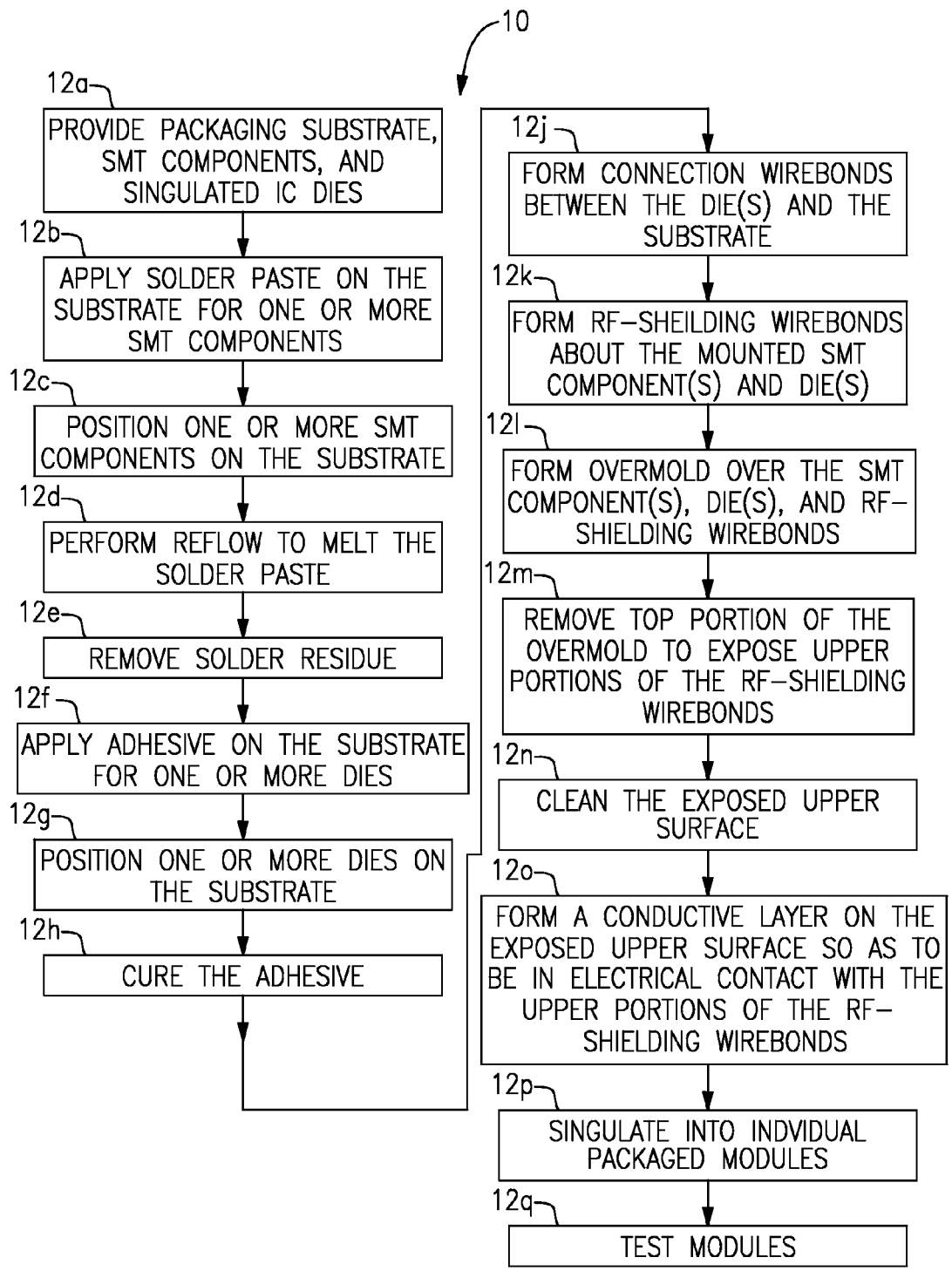
FIG. 1 shows a process that can be implemented to fabricate a packaged module that includes a die having an integrated circuit (IC).

FIG. 1 shows a process 10 that can be implemented to fabricate a packaged module having and/or via one or more features as described herein. FIG. 2 shows various parts and/or stages of various steps associated with the process 10 of FIG. 1.

In block 12a of FIG. 1, a packaging substrate and parts to be mounted on the packaging substrate can be provided. Such parts can include, for example, one or more surface-mount technology (SMT) components and one or more singulated dies having integrated circuits (ICs). FIGS. 2A1 and 2A2 show that in some embodiments, the packaging substrate can include a laminate panel 16. FIG. 2A1 shows the example panel's front side; and FIG. 2A2 shows the panel's back side. The panel 16 can include a plurality of individual module substrates 20 arranged in groups that are sometimes referred to as cookies 18.

FIGS. 2B1-2B3 show front, side and back, respectively, of an example configuration of the individual module substrate 20. For the purpose of description herein, a boundary 22 can define an area occupied by the module substrate 20 on the panel 16. Within the boundary 22, the module substrate 20 can include a front surface 21 and a back surface 27. Shown on the front surface 21 is an example mounting area 23 dimensioned to receive a die (not shown). A plurality of example contact pads 24 (e.g., connection wirebond contact pads) are arranged about the die-receiving area 23 so as to allow formation of electrical connections between the die and contact pads 28 arranged on the back surface 27. Although not shown, electrical connections between the wirebond contact pads 24 and the module's contact pads 28 can be configured in a number of ways. Also within the boundary 22 are two sets of example contact pads 25 configured to allow mounting of, for example passive SMT devices (not shown). The contact pads 25 can be electrically connected to some of the module's contact pads 28 and/or ground contact pads 29 disposed on the back surface 27. Also within the boundary 22 are a plurality of wirebond pads 26 configured to allow formation of a plurality of EM-isolating wirebonds (not shown). The wirebond pads 26 can be electrically connected to an electrical reference plane (such as a ground plane) 30. Such connections between the wirebond pads 26 and the ground plane 30 (depicted as dotted lines 31) can be achieved in a number of ways. In some embodiments, the ground plane 30 may or may not be connected to the ground contact pads 29 disposed on the back surface 27.

Figure 2C:
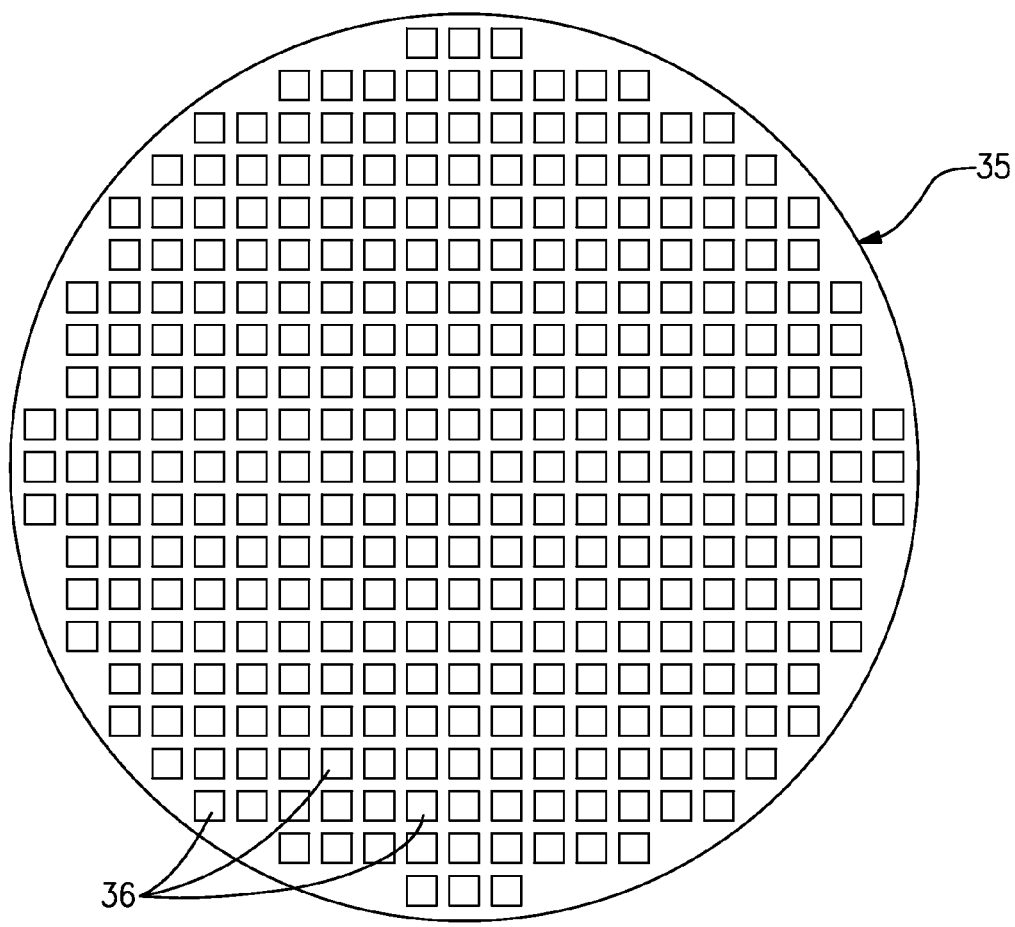
FIG. 2C shows an example of a fabricated semiconductor wafer having a plurality of dies that can be singulated for mounting on the laminate substrate.
Figure 2D:
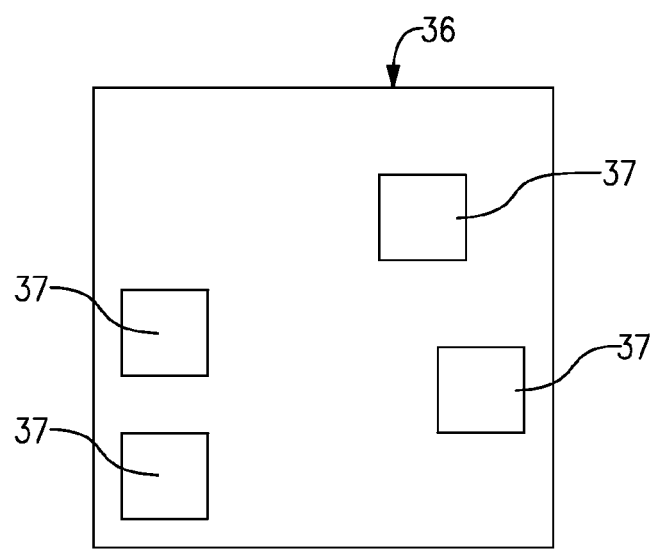
FIG. 2D depicts an individual die showing example electrical contact pads for facilitating connectivity when mounted on the laminate substrate.

FIG. 2C shows an example fabricated wafer 35 that includes a plurality of functional dies 36 awaiting to be cut (or sometimes referred to as singulated) into individual dies. Such cutting of the dies 36 can be achieved in a number of ways. FIG. 2D schematically depicts an individual die 36 where a plurality of metalized contact pads 37 can be provided. Such contact pads can be configured to allow formation of connection wirebonds between the die 36 and the contact pads 24 of the module substrate (e.g., FIG. 2B1).

In block 12b of FIG. 1, solder paste can be applied on the module substrate to allow mounting of one or more SMT devices. FIGS. 2E1 and 2E2 show an example configuration 40 where solder paste 41 is provided on each of the contact pads 25 on the front surface of the module substrate 20. In some implementations, the solder paste 41 can be applied to desired locations on the panel (e.g., 16 in FIG. 2A1) in desired amount by an SMT stencil printer.

In block 12c of FIG. 1, one or more SMT devices can be positioned on the solder contacts having solder paste. FIGS. 2F1 and 2F2 show an example configuration 42 where example SMT devices 43 are positioned on the solder paste 41 provided on each of the contact pads 25. In some implementations, the SMT devices 43 can be positioned on desired locations on the panel by an automated machine that is fed with SMT devices from tape reels.

In block 12d of FIG. 1, a reflow operation can be performed to melt the solder paste to solder the one or more SMT devices on their respective contact pads. In some implementations, the solder paste 41 can be selected and the reflow operation can be performed to melt the solder paste 41 at a first temperature to thereby allow formation of desired solder contacts between the contact pads 25 and the SMT devices 43.

In block 12e of FIG. 1, solder residue from the reflow operation of block 12d can be removed. By way of an example, the substrates can be run through a solvent or aqueous cleaning step. Such a cleaning step can be achieved by, for example, a nozzle spray, vapor chamber, or full immersion in liquid.

In block 12f of FIG. 1, adhesive can be applied on one or more selected areas on the module substrate 20 to allow mounting of one or more dies. FIGS. 2G1 and 2G2 show an example configuration 44 where adhesive 45 is applied in the die-mounting area 23. In some implementations, the adhesive 45 can be applied to desired locations on the panel (e.g., 16 in FIG. 2A1) in desired amount by techniques such as screen printing.

In block 12g of FIG. 1, one or more dies can be positioned on the selected areas with adhesive applied thereon. FIGS. 2H1 and 2H2 show an example configuration 46 where an example die 36 is positioned on the die-mounting area 23 via the adhesive 45. In some implementations, the die 36 can be positioned on the die-mounting area on the panel by an automated machine that is fed with dies from a tape reel.

In block 12h of FIG. 1, the adhesive between the die the die-mounting area can be cured. Preferably, such a curing operation can be performed at one or more temperatures that are lower than the above-described reflow operation for mounting of the one or more SMT devices on their respective contact pads. Such a configuration allows the solder connections of the SMT devices to remain intact during the curing operation.

In block 12j of FIG. 1, electrical connections such as wirebonds can be formed between the mounted die(s) and corresponding contact pads on the module substrate 20. FIGS. 2I1 and 2I2 show an example configuration 48 where a number of wirebonds 49 are formed between the contact pads 37 of the die 36 and the contact pads 24 of the module substrate 20. Such wirebonds can provide electrical connections for signals and/or power to and from one or more circuits of the die 36. In some implementations, the formation of the foregoing wirebonds can be achieved by an automated wirebonding machine.

In block 12k of FIG. 1, a plurality of RF-shielding wirebonds can be formed about a selected area on the module substrate 20. FIGS. 2J1 and 2J2 show an example configuration 50 where a plurality of RF-shielding wirebonds 51 are formed on wirebond pads 26. The wirebond pads 26 are schematically depicted as being electrically connected (dotted lines 31) with one or more reference planes such as a ground plane 30. In some embodiments, such a ground plane can be disposed within the module substrate 20. The foregoing electrical connections between the RF-shielding wirebonds 51 and the ground plane 30 can yield an interconnected RF-shielding structure at sides and underside of the area defined by the RF-shielding wirebonds 51. As described herein, a conductive layer can be formed above such an area and connected to upper portions of the RF-shielding wirebonds 51 to thereby form an RF-shielded volume.

In the example configuration 50, the RF-shielding wirebonds 51 are shown to form a perimeter around the area where the die (36) and the SMT devices (43) are located. Other perimeter configurations are also possible. For example, a perimeter can be formed with RF-wirebonds around the die, around one or more of the SMT devices, or any combination thereof. In some implementations, an RF-wirebond-based perimeter can be formed around any circuit, device, component or area where RF-isolation is desired. For the purpose of description, it will be understood that RF-isolation can include keeping RF signals or noise from entering or leaving a given shielded area.

In the example configuration 50, the RF-shielding wirebonds 51 are shown to have an asymmetrical side profile configured to facilitate controlled deformation during a molding process as described herein. Additional details concerning such wirebonds can be found in, for example, PCT Publication No. WO 2010/014103 titled "SEMICONDUCTOR PACKAGE WITH INTEGRATED INTERFERENCE SHIELDING AND METHOD OF MANUFACTURE THEREOF." In some embodiments, other shaped RF-shielding wirebonds can also be utilized. For example, generally symmetric arch-shaped wirebonds as described in U.S. Pat. No. 8,071,431, titled "OVERMOLDED SEMICONDUCTOR PACKAGE WITH A WIREBOND CAGE FOR EMI SHIELDING," can be used as RF-shielding wirebonds in place of or in combination with the shown asymmetric wirebonds. In some embodiments, RF-shielding wirebonds do not necessarily need to form a loop shape and have both ends on the surface of the module substrate. For example, wire extensions with one end on the surface of the module substrate and the other end positioned above the surface (for connecting to an upper conductive layer) can also be utilized.

In the example configuration 50 of FIGS. 2J1 and 2J2, the RF-shielding wirebonds 51 are shown to have similar heights that are generally higher than heights of the die-connecting wirebonds (49). Such a configuration allows the die-connecting wirebonds (49) to be encapsulated by molding compound as described herein, and be isolated from an upper conductive layer to be formed after the molding process.

Figure 2K:
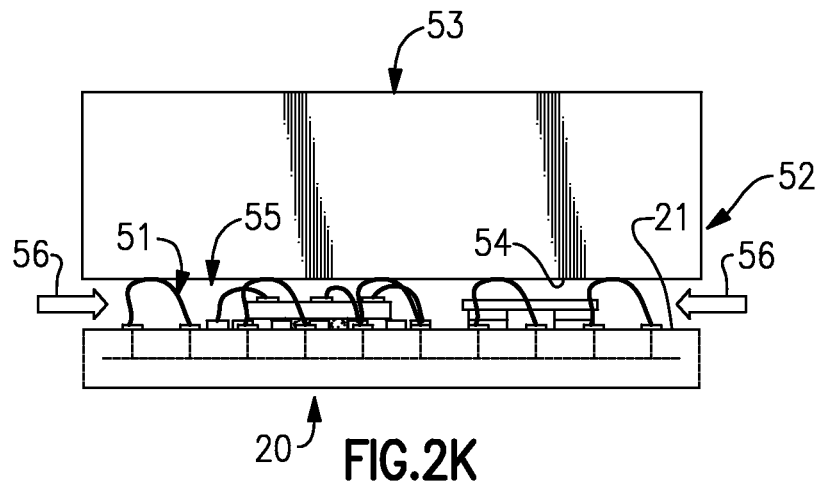
FIG. 2K shows a side view of molding configuration for introducing molding compound to a region above the laminate substrate.

In block 12l of FIG. 1, an overmold can be formed over the SMT component(s), die(s), and RF-shielding wirebonds. FIG. 2K shows an example configuration 52 that can facilitate formation of such an overmold. A mold cap 53 is shown to be positioned above the module substrate 20 so that the lower surface 54 of the mold cap 53 and the upper surface 21 of the module substrate 20 define a volume 55 where molding compound can be introduced.

In some implementations, the mold cap 53 can be positioned so that its lower surface 54 engages and pushes down on the upper portions of the RF-shielding wirebonds 51. Such a configuration allows whatever height variations in the RF-shielding wirebonds 51 to be removed so that the upper portions touching the lower surface 54 of the mold cap 53 are at substantially the same height. When the mold compound is introduced and an overmold structure is formed, the foregoing technique maintains the upper portions of the encapsulated RF-shielding wirebonds 51 at or close to the resulting upper surface of the overmold structure.

In the example molding configuration 52 of FIG. 2K, molding compound can be introduced from one or more sides of the molding volume 55 as indicated by arrows 56. In some implementations, such an introduction of molding compound can be performed under heated and vacuum condition to facilitate easier flow of the heated molding compound into the volume 55.

Figure 2L:
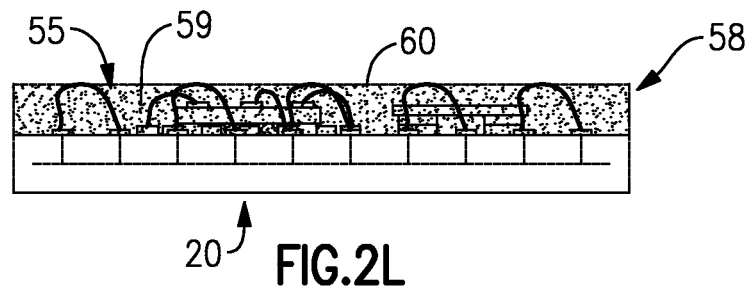
FIG. 2L shows a side view of an overmold formed via the molding configuration of FIG. 2K.

FIG. 2L shows an example configuration 58 where molding compound has been introduced into the volume 55 as described in reference to FIG. 2K and the molding cap removed to yield an overmold structure 59 that encapsulates the various parts (e.g., die, die-connecting wirebonds, and SMT devices). The RF-shielding wirebonds are also shown to be substantially encapsulated by the overmold structure 59. The upper portions of the RF-shielding wirebonds are shown to be at or close to the upper surface 60 of the overmold structure 59.

Figure 2M:
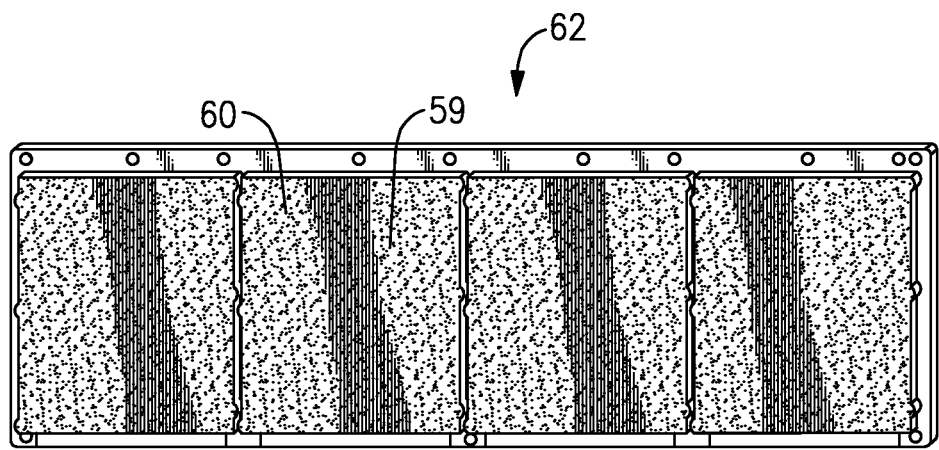
FIG. 2M shows the front side of a panel with the overmold.

FIG. 2M shows an example panel 62 that has overmold structures 59 formed over the multiple cookie sections. Each cookie section's overmold structure can be formed as described herein in reference to FIGS. 2K and 2L. The resulting overmold structure 59 is shown to define a common upper surface 60 that covers the multiple modules of a given cookie section.

The molding process described herein in reference to FIGS. 2K-2M can yield a configuration where upper portions of the encapsulated RF-shielding wirebonds are at or close to the upper surface of the overmold structure. Such a configuration may or may not result in the RF-shielding wirebonds forming a reliable electrical connection with an upper conductor layer to be formed thereon.

Figure 2N:
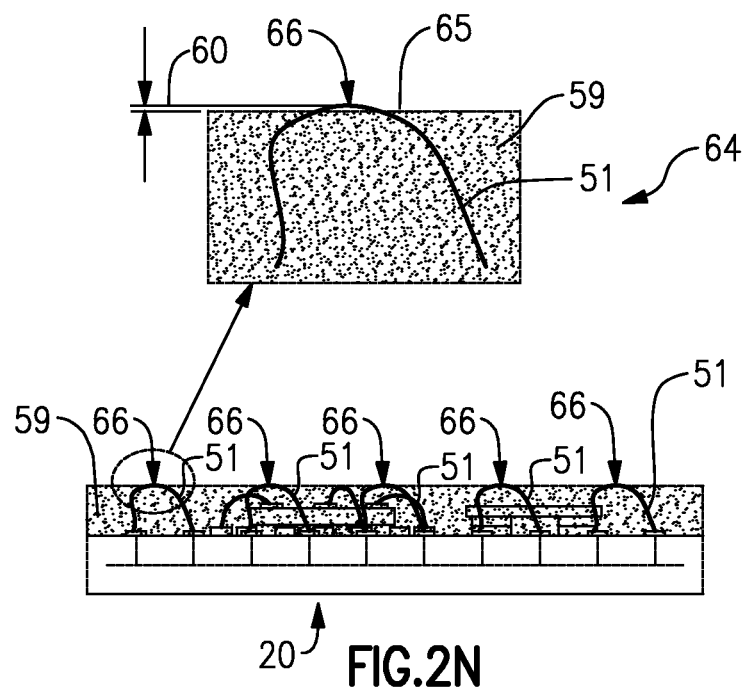
FIG. 2N shows a side view of how an upper portion of the overmold can be removed to expose upper portions of the EM isolation wirebonds.

In block 12m of FIG. 1, a top portion of the overmold structure can be removed to better expose upper portions of the RF-shielding wirebonds. FIG. 2N shows an example configuration 64 where such a removal has been performed. In the example, the upper portion of the overmold structure 59 is shown to be removed to yield a new upper surface 65 that is lower than the original upper surface 60 (from the molding process). Such a removal of material is shown to better expose the upper portions 66 of the RF-shielding wirebonds 51.

Figure 2O:
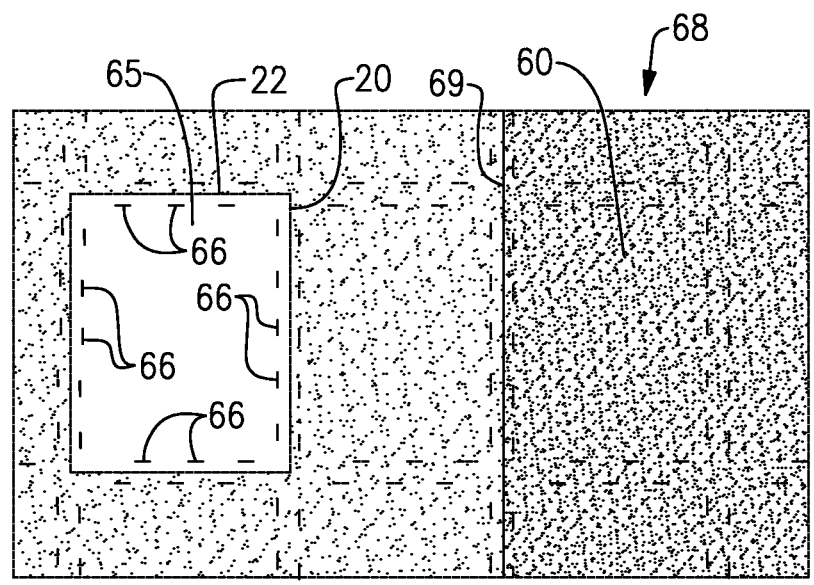
FIG. 2O shows a portion of a panel where a portion of the overmold has its upper portion removed to better expose the upper portions of the EM isolation wirebonds.

The foregoing removal of material from the upper portion of the overmold structure 59 can be achieved in a number of ways. FIG. 2O shows an example configuration 68 where such removal of material is achieved by sand-blasting. In the example, the left portion is where material has been removed to yield the new upper surface 65 and better exposed upper portions 66 of the RF-shielding wirebonds. The right portion is where material has not been removed, so that the original upper surface 60 still remains. The region indicated as 69 is where the material-removal is being performed.

In the example shown in FIG. 2O, a modular structure corresponding to the underlying module substrate 20 (depicted with a dotted box 22) is readily apparent from the exposed upper portions 66 of the RF-shielding wirebonds that are mostly encapsulated by the overmold structure 59. Such modules will be separated after a conductive layer is formed over the newly formed upper surface 65.

In block 12n of FIG. 1, the new exposed upper surface resulting from the removal of material can be cleaned. By way of an example, the substrates can be run through a solvent or aqueous cleaning step. Such a cleaning step can be achieved by, for example, a nozzle spray, or full immersion in liquid.

In block 12o of FIG. 1, an electrically conductive layer can be formed on the new exposed upper surface of the overmold structure, so that the conductive layer is in electrical contact with the upper portions of the RF-shielding wirebonds. Such a conductive layer can be formed by a number of different techniques, including methods such as spraying or printing.

Figure 2P:
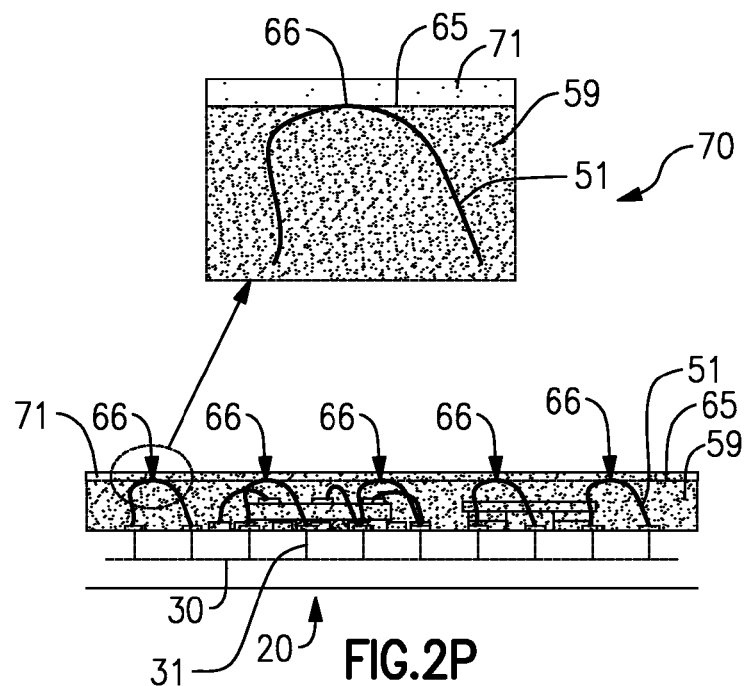
FIG. 2P shows a side view of a conductive layer formed over the overmold such that the conductive layer is in electrical contact with the exposed upper portions of the EM isolation wirebonds.

FIG. 2P shows an example configuration 70 where an electrically conductive layer 71 has been formed over the upper surface 65 of the overmold structure 59. As described herein, the upper surface 65 better exposes the upper portions 66 of the RF-shielding wirebonds 51. Accordingly, the formed conductive layer 71 forms improved contacts with the upper portions 66 of the RF-shielding wirebonds 51.

As described in reference to FIG. 2J, the RF-shielding wirebonds 51 and the ground plane 30 can yield an interconnected RF-shielding structure at sides and underside of the area defined by the RF-shielding wirebonds 51. With the upper conductive layer 71 in electrical contact with the RF-shielding wirebonds 51, the upper side above the area is now shielded as well, thereby yielding a shielded volume.

Figure 2Q:
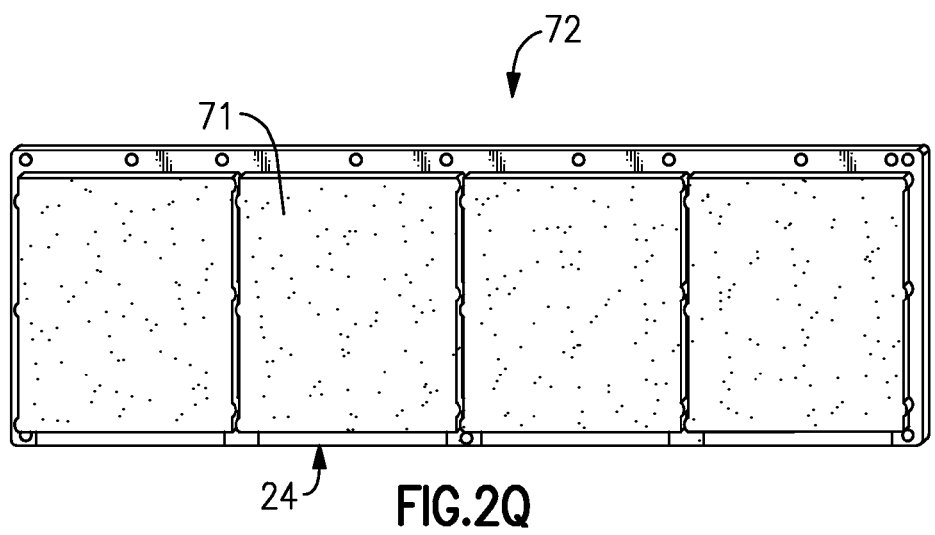
FIG. 2Q shows a panel where the conductive layer can be a spray-on metallic paint.

FIG. 2Q shows an example panel 72 that has been sprayed with conductive paint to yield an electrically conductive layer 71 that covers multiple cookie sections. As described in reference to FIG. 2M, each cookie section includes multiple modules that will be separated.

In block 12p of FIG. 1, the modules in a cookie section having a common conductive layer (e.g., a conductive paint layer) can be singulated into individual packaged modules. Such singulation of modules can be achieved in a number of ways, including a sawing technique.

FIG. 2R shows an example configuration 74 where the modular section 20 described herein has been singulated into a separated module 75. The overmold portion is shown to include a side wall 77; and the module substrate portion is shown to include a side wall 76. Collectively, the side walls 77 and 76 are shown to define a side wall 78 of the separated module 75. The upper portion of the separated module 75 remains covered by the conductive layer 71. As described herein in reference to FIG. 2B, the lower surface 27 of the separated module 75 includes contact pads 28, 29 to facilitate electrical connections between the module 75 and a circuit board such as a phone board.

FIGS. 2S1, 2S2 and 2S3 show front (also referred to as top herein), back (also referred to as bottom herein) and perspective views of the singulated module 75. As described herein, such a module includes RF-shielding structures encapsulated within the overmold structure; and in some implementations, the overall dimensions of the module 75 is not necessarily any larger than a module without the RF-shielding functionality. Accordingly, modules having integrated RF-shielding functionality can advantageously yield a more compact assembled circuit board since external RF-shield structures are not needed. Further, the packaged modular form allows the modules to be handled easier during manipulation and assembly processes.

In block 12q of FIG. 1, the singulated modules can be tested for proper functionality. As discussed above, the modular form allows such testing to be performed easier. Further, the module's internal RF-shielding functionality allows such testing to be performed without external RF-shielding devices.

Figure 2T:
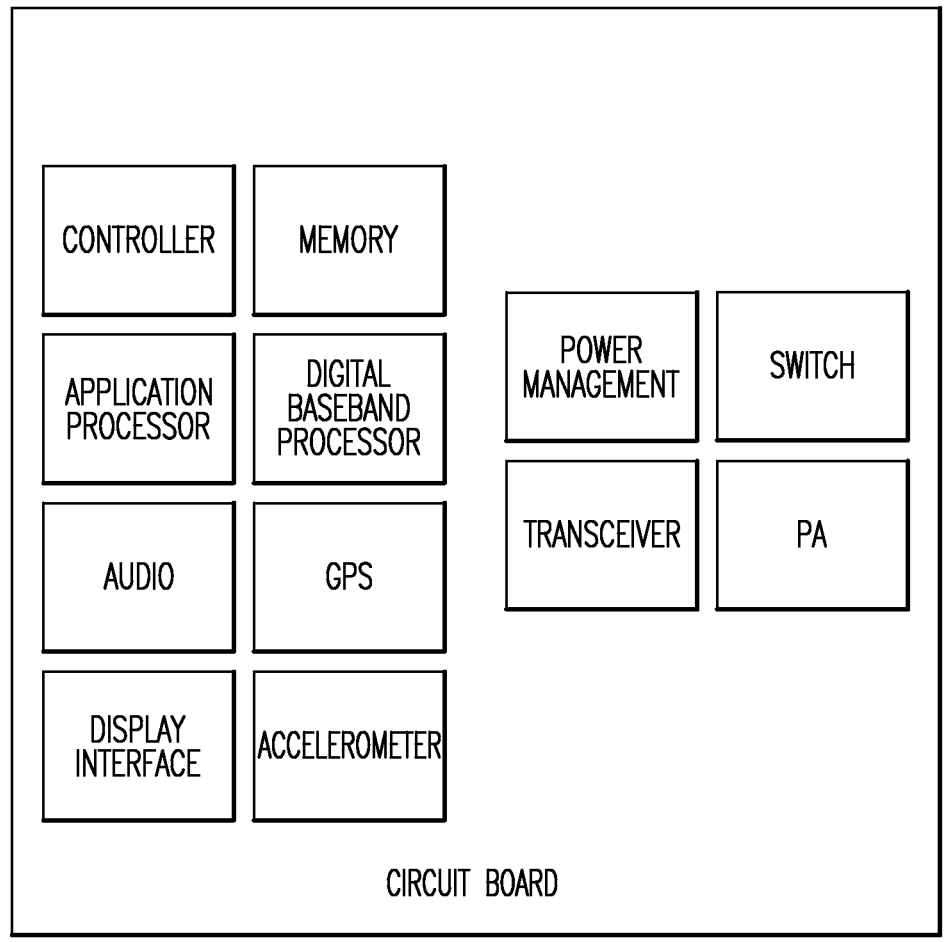
FIG. 2T shows that one or more of modules that are mounted on a circuit board such as a wireless phone board can include one or more features as described herein.

FIG. 2T shows that in some embodiments, one or more of modules included in a circuit board such as a wireless phone board can be configured with one or more packaging features as described herein. Non-limiting examples of modules that can benefit from such packaging features include, but are not limited to, a controller module, an application processor module, an audio module, a display interface module, a memory module, a digital baseband processor module, GPS module, an accelerometer module, a power management module, a transceiver module, a switching module, and a power amplifier module.

FIG. 3A shows a process 80 that can be implemented to assemble a packaged module having one or more features as described herein on a circuit board. In block 82*a*, a packaged module can be provided. In some embodiments, the packaged module can represent a module described in reference to FIG. 2T. In block 82*b*, the packaged module can be mounted on a circuit board (e.g., a phone board). FIG. 3B schematically depicts a resulting circuit board 90 having module 91 mounted thereon. The circuit board can also include other features such as a plurality of connections 92 to facilitate operations of various modules mounted thereon.

In block 82*c*, a circuit board having modules mounted thereon can be installed in a wireless device. FIG. 3C schematically depicts a wireless device 94 (e.g., a cellular phone) having a circuit board 90 (e.g., a phone board). The circuit board 90 is shown to include a module 91 having one or more features as described herein. The wireless device is shown to further include other components, such as an antenna 95, a user interface 96, and a power supply 97.

As described in reference to FIGS. 2P and 2Q, the electrically conductive layer 71 can be formed by, for example, spraying of conductive paint. Such spraying of conductive paint can be performed on a given panel having multiple modular devices yet to be singulated.

Conductive paints used for such spraying applications typically have metal flakes suspended in a solvent. A proper suspension is desirable since it can affect the spray process, spray equipment, and/or quality of the resulting conductive layer. For example, metal flakes can separate from the solvent and settle on a lower portion of a paint reservoir, thereby yielding a gradient in metal flake density. Such a gradient can affect spray-ability of some portions of such non-uniform paint. If a more dense portion is sprayed, the paint can clog equipments such as a spray head. The resulting sprayed-on conductive layer can have uneven thickness as well as uneven metal distribution (thereby affecting reliability).

Described herein are examples of systems, devices, and methods for effectively maintaining and delivering conductive paint such as metallic paint. Although described in the context of spraying metallic paint to form a conductive layer on a panel having an array of modules, it will be understood that one or more features of the present disclosure can also be implemented in other application.

Figure 4:
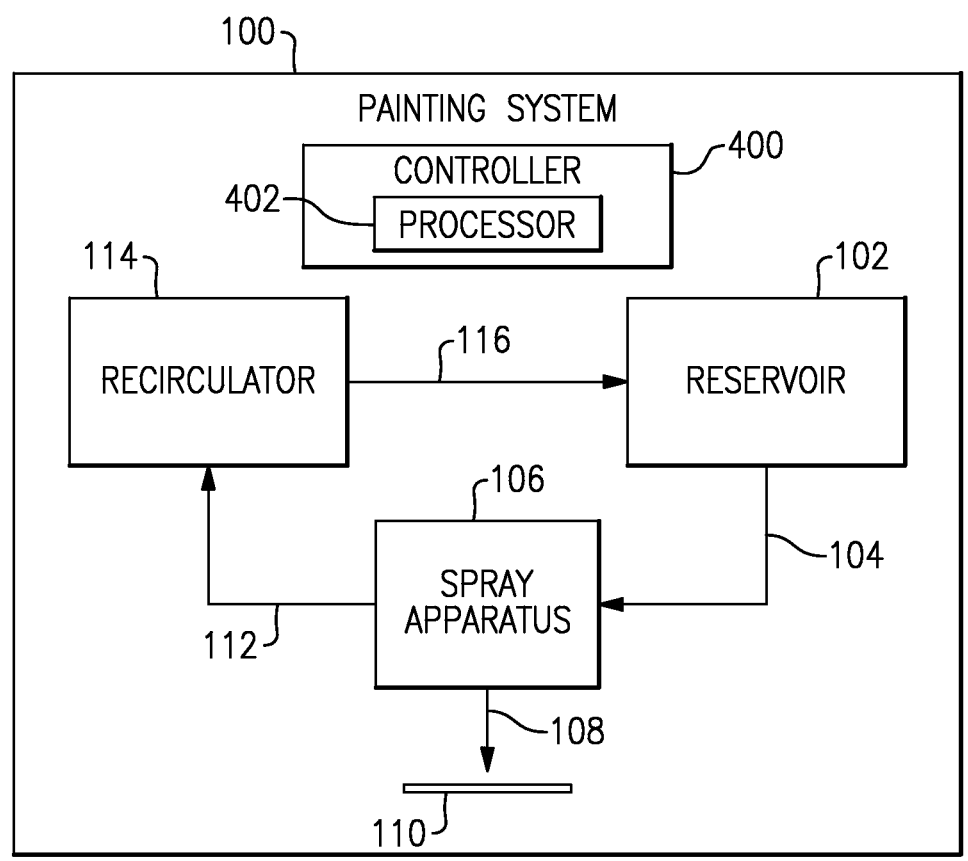
FIG. 4 schematically depicts a painting system that can be utilized to apply metallic paint such as a conductive layer of FIGS. 2P and 2Q, where the painting system can include a paint reservoir, a spray apparatus, and a recirculating apparatus.

FIG. 4 schematically depicts a painting system 100 having a plurality of components that can allow metallic paint to be maintained with a relatively uniform suspension consistency, as well as deliver such metallic paint to a spray head for spray application. The system 100 can include a reservoir 102 configured to hold metallic paint and deliver (arrow 104) the paint to a spray apparatus 106. If the paint is to be sprayed, the spray apparatus 106 can spray the paint (arrow 108) to a panel 110. If the spraying operation is not active, the paint delivered to the spray apparatus 106 can be routed (arrow 112) to a recirculator 114. The recirculator 114 can be configured to return the paint (arrow 116) to the reservoir 102. As describe herein, the recirculator 114 can facilitate achieving of and maintaining a desired level of suspension of the paint in an effective manner.

FIG. 4 shows that in some embodiments, at least some features associated with the painting system 100 can be facilitated by a controller 400. Such a controller can include or be in communication with a processor 402 configured to facilitate such control functionalities. Such functionalities can include, for example, switching between a spray mode (e.g., where paint is sprayed) and a recirculation mode (e.g., where paint is recirculated). Examples of such functionalities are described herein in greater detail. In some embodiments, the controller 402 can include or be in communication with a computer readable medium (CRM), including a non-transitory CRM.

Various examples of the reservoir 102, the spray apparatus 106, and the recirculator 114 are described herein. FIGS. 5-9 are generally directed to various examples of the recirculator 114 and how it can be incorporated into a painting system to yield desirable results. FIGS. 10-17 are generally directed to various examples of the spray apparatus and how it can be incorporated into a painting system to yield desirable results. In some implementations, one or more features of the recirculator 114 can be combined with one or more features of the spray apparatus 106. It will be understood, however, that each of the recirculator 114 and the spray apparatus 106 can operate without necessarily relying on the features provided by the other component.

Figure 5:
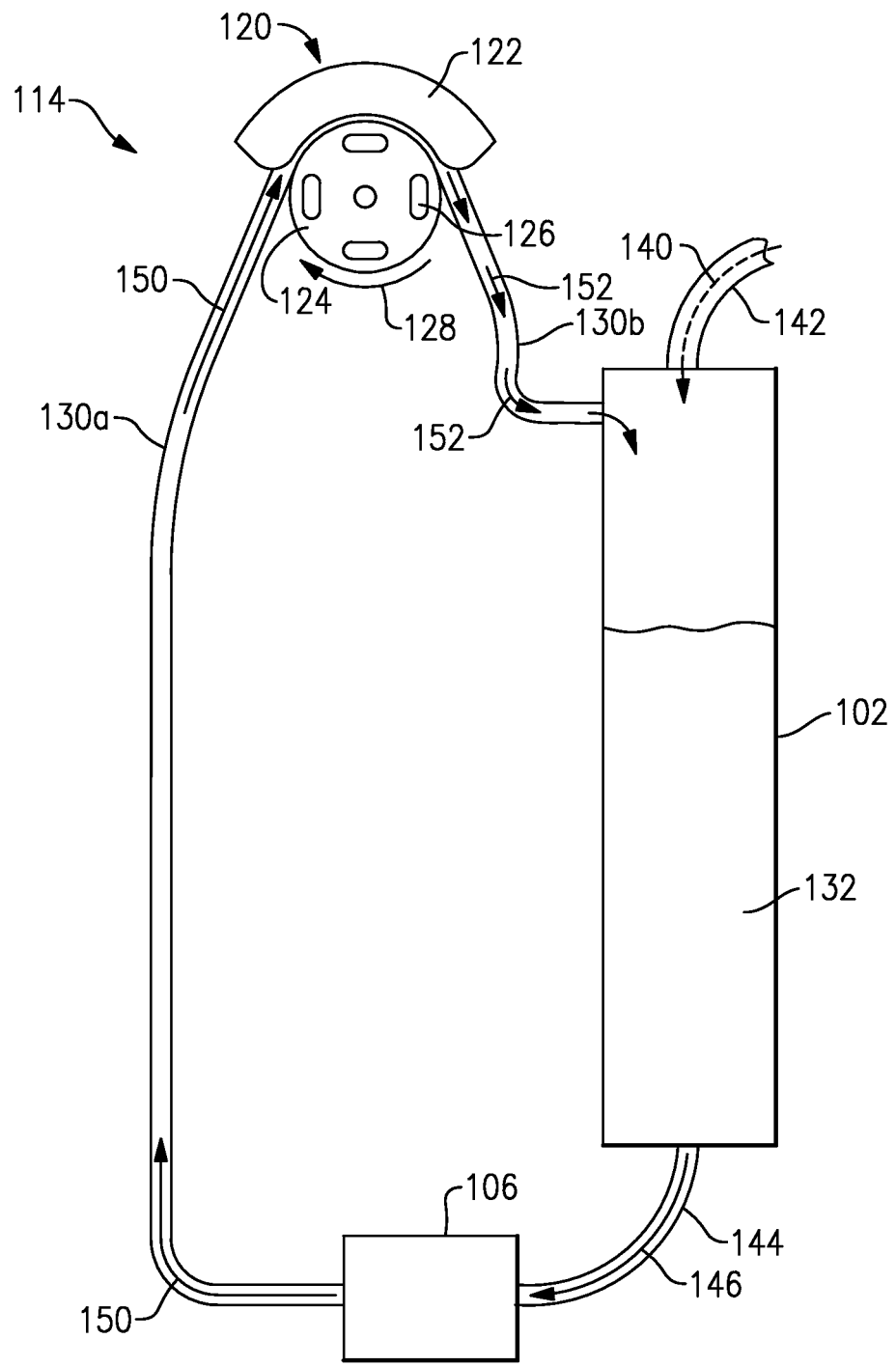
FIG. 5 depicts an example configuration of the painting system where the recirculating apparatus can include a peristaltic pump.

FIG. 5 shows that in some implementations, the recirculator 114 of FIG. 4 can include a peristaltic pump 120 that receives, as input, paint (depicted as arrows 150) through a tube 130*a* from a spray apparatus 106. As described herein, the spray apparatus 106 can route the paint to the peristaltic pump 120 when the paint is not being sprayed. It will be understood that functionalities and benefits associated with the peristaltic pump 120 to recirculate the paint can remain even if the spray apparatus 106 is absent or bypassed completely.

The example peristaltic pump 120 is shown to include a roller 124 with one or more wipers 126 that provide peristalsis action when rotated (arrow 128) against the tube (130*a* and/or 130*b*) backed by a shroud 122. The peristalsis action of the pump 120 is shown to pump the input paint 150 as an output paint (arrows 152) that is returned to a reservoir 102 through the output portion of the tube (130*b*).

The foregoing peristalsis action of the pump 120 can provide agitation of the metallic paint, so that the paint within the circulation system (including the paint 132 in the reservoir 102) maintains a desired level of suspension. As described herein, such a desired level of suspension can be achieved relatively quickly even from a separated state, and maintained for a significant duration.

In FIG. 5, paint (arrow 146) from the reservoir 102 can be provided to the spray apparatus 106 through a tube 144, thereby completing a circuit in the context of recirculation. Compressed gas (arrow 140) provided to the reservoir 102 through a tube 142 can provide pressure to push the paint from the reservoir 102 to the spray apparatus 106.

In some embodiments, the foregoing recirculation circuit can be implemented as a closed system. The tube (130*a* and/or 130*b*) can remain closed before (as portion 130*a*), during, and/or after (as portion 130*b*) the peristalsis action. Thus, in addition to the agitating property, the peristaltic pump 120 can be particularly suitable for use in such a closed system. In the context of metallic paints that typically have high vapor pressure solvents, the closed system facilitated by the peristaltic pump 120 can be particularly advantageous.

Figure 6:
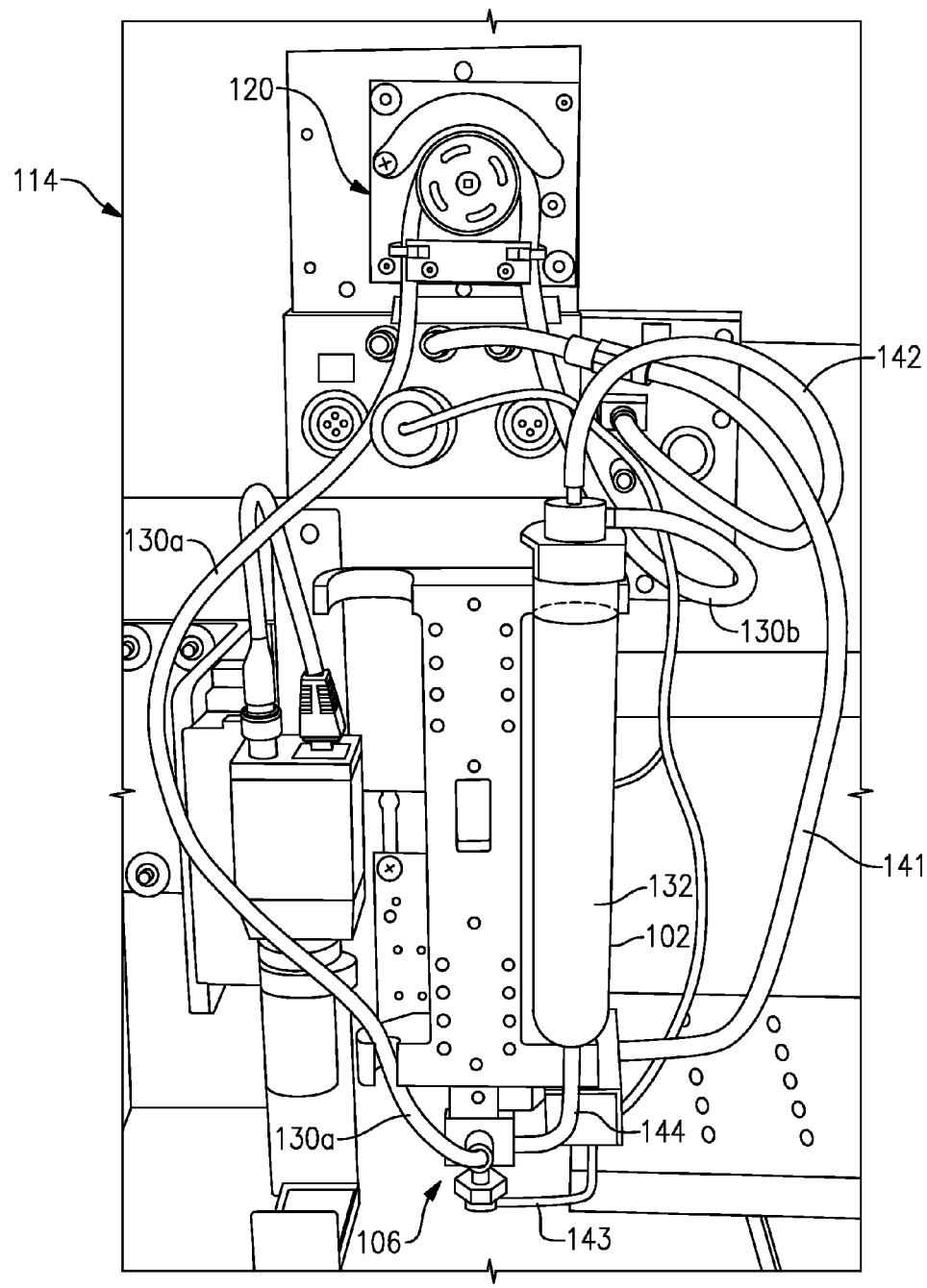
FIG. 6 shows an example of a working painting system of FIG. 5.

FIG. 6 shows an example of a working painting system of FIG. 5. In the example shown, the reservoir 102 is dimensioned to hold approximately 55 cc. The reservoir 102 is sometimes referred to herein as a storage cartridge. In some embodiments, such a storage cartridge can be configured to be refillable by an operator, be configured as a disposable module, or some combination thereof. Although described in the context of the example 55 cc cartridge, cartridges having larger or smaller volumes can also be utilized, and metallic paint stored and recirculated therein can be maintained with a desired level of suspension by techniques described herein. For example, in a production scale setting, a 6 oz cartridge can be used for smaller runs, and a 20 oz cartridge can be used for a high-volume run. As described herein, the agitating feature of the peristaltic pump can be generally independent of the cartridge size. Thus, such flexibility in cartridge sizes can be provided.

The example peristaltic pump 120 shown in FIG. 6 is a Watson-Marlow 400F/B1 peristaltic pump. Such a pump can be operated at different speeds and/or with different tube bore sizes to achieve different flow rates. For example, such a pump operated at about 250 RPM can yield the following example flow rates: 2.5 ml/min with a 0.5 mm tube bore size, 7.5 ml/min with a 0.8 mm tube bore size, 27 ml/min with a 1.6 mm tube bore size, 60 ml/min with a 2.4 mm tube bore size, 103 ml/min with a 3.2 mm tube bore size, and 148 ml/min with a 4.0 mm tube bore size.

One can see that the peristaltic pump 120 can be relatively small. By using such a small peristaltic pump it is possible to mount the pump 120 close to or on an actual head of the spray system. Such an arrangement can allow use of a relatively short fluid path (e.g., tubing portion 130a) between the spray apparatus 106 and the pump 120, as well as a relatively short fluid path (e.g., tubing portion 130b) between the pump 120 and the reservoir 102. In some embodiments, the total length of the foregoing assembly of tubings can be less than or equal to about 30 inches or 15 inches. For the example shown in FIG. 6, such a total length is about 30 inches.

In some implementations, operating parameters such as the diameter of tubing line (130a and/or 130b) and rotational rate of the pump 120 can be selected to, for example, yield desired turnover of the paint 132 to keep the metal flakes in proper suspension, as well as to keep the amount of paint needed to purge the recirculation system to a minimum or a reduced amount. The foregoing examples of performance improvements can be particularly useful for a number of reasons. For example, some metallic paints include precious metal flakes and therefore are relatively expensive. Thus, minimizing or reducing any waste of such metallic paints for the purging process can provide a significant cost advantage. In another example, the close proximity of the pump 120 from the spray apparatus 106 can allow the recirculation process to occur quicker and thereby maintain an acceptable level of suspension uniformity over an extended period of time. Such features can be highly desirable in high-volume manufacturing applications.

Although described in the context of a rotary-type peristaltic pump, it will be understood that one or more features of the present disclosure can be implemented in other types of peristaltic pump. For example, a linear-type peristaltic pump can be utilized.

In FIG. 6, a tube 142 is depicted as delivering compressed gas (e.g., air) from a gas source to the upper portion of the reservoir 102 to provide pressure to push the paint from the reservoir 102 to the spray apparatus 106 (through tube 144). A tube 143 is depicted as delivering compressed gas (e.g., air) to the spray apparatus 106 to, for example, provide atomizer functionality. As shown, such compressed gas can be provided from a source, through a tube 141 and an interface block. Additional details concerning such atomizer functionality are described herein.

FIGS. 7-9 show examples of how one or more features described in reference to FIGS. 4-6 can allow metallic paint to reach a desired suspension state and maintain such a state for an extended period of time during operation. In an example demonstration, and as shown in FIG. 7A, a paint reservoir 102 was provided with an existing volume of paint 160. Approximately 10 cc of solvent 162 was added to the reservoir 102, and the recirculating system was operated for approximately 5 minutes to yield a mixed paint 164 as shown in FIG. 7B. The added solvent 162 of FIG. 7A was mixed with the existing paint substantially completely to yield the mixed paint 164.

Figure 7A:
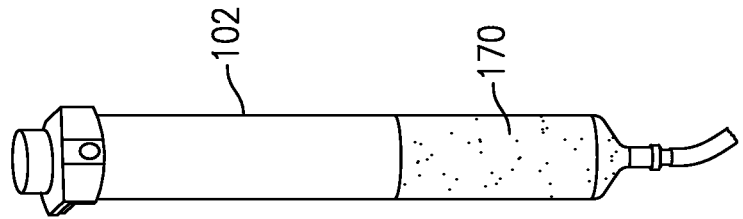
FIGS. 7A-7D show examples of how the recirculating apparatus can readily agitate metallic paint to form and maintain a desired suspension of particles in solution.
Figure 7B:
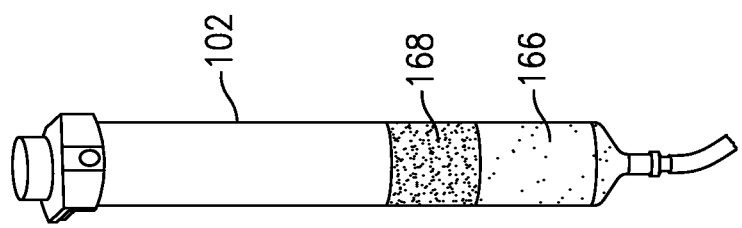
Figure 7C:
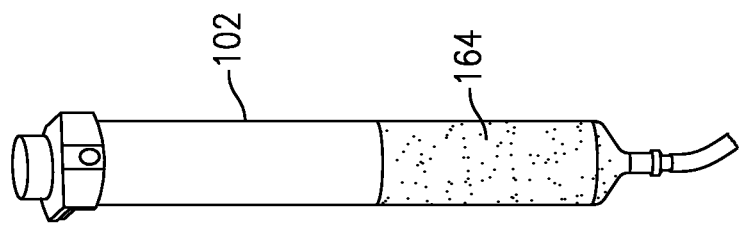
Figure 7D:
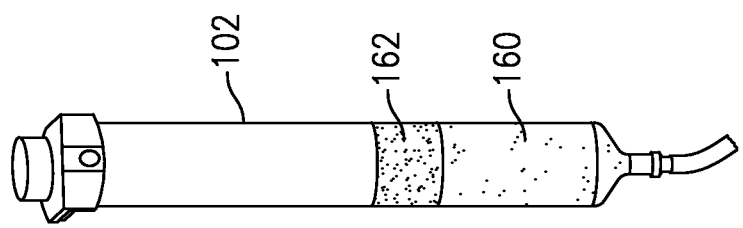

The mixed paint 164 was then left without further recirculation for approximately 5 hours, and the resulting separation of solvent 168 and settled paint 166 is depicted in FIG. 7C. The separated solvent 168 and the settled paint 166 were circulated through the recirculating system again for approximately 5 minutes; and again, the resulting re-mixing of the separated solvent 168 and the settled paint 166 was substantially complete to yield the re-mixed paint 170.

Based on the foregoing example, one can see that achieving a desired suspension state of paint can be relatively quick, especially when compared to some operating durations associated with high-volume production settings. Once such a desirable suspension state is reached, it may be more desirable to be able to maintain such a state for an extended period of operation.

There are a number of operating conditions that can work against such a state over time. For example, there can be leaks in a closed system where loss of materials (e.g., solvent vapor) can occur. In another example, paint particles can build up at various locations in a painting system to cause clogs and other complications.

FIGS. 8A-8C show that one or more features as described in FIGS. 4-7 can allow a recirculating system to operate for an extended period of time while maintaining a desired paint suspension level. FIG. 8A shows a volume of paint 132 (approximately ⅛ of pint) loaded in the reservoir 102. The initial paint level is indicated by a dotted line 180. After approximately 24 hours of spraying operations and recirculation (e.g., spraying operation once per hour for the first 9 hours, followed by recirculation only for the remaining time), the paint volume is shown to have decreased to a level indicated as 182 in FIG. 8B. FIG. 8C is an enlarged view of the reservoir having the remaining paint 132. The remaining paint 132 is shown to have a desired level of paint suspension.

In one test, a 24-hour period of spraying operations and recirculation similar to that described in reference to FIGS. 8A-8C resulted in example spray products listed in Table 1.

TABLE 1

| Time (hour) | Solids content (%) | Wt. Avg. (mg) | Painted layer thickness (Sample 1, frame) (μm) | Painted layer thickness (Sample 1, flood) (μm) | Painted layer thickness (Sample 2, frame) (μm) | Painted layer thickness (Sample 2, flood) (μm) |
|---|---|---|---|---|---|---|
| 0 | 65.7 | 124.43 | 51.86 | 44.78 | 51.62 | 43.45 |
| 1 | 65.7 | 119.00 | 60.24 | 49.84 | 53.65 | 51.09 |
| 2 | 66.2 | 116.10 | 59.39 | 50.92 | 61.62 | 56.48 |
| 3 | 66.1 | 122.33 | 45.47 | 39.74 | 45.36 | 36.55 |
| 4 | 66.6 | 99.10 | 48.29 | 44.33 | 52.69 | 50.34 |
| 5 | 66.4 | 119.10 | 39.56 | 39.36 | 40.43 | 35.65 |
| 6 | 66.6 | 102.90 | 50.91 | 48.21 | 57.69 | 54.70 |
| 7 | 66.7 | 81.33 | 48.10 | 46.05 | 57.80 | 56.00 |
| 8 | 67.0 | 111.83 | 55.64 | 47.83 | 58.30 | 58.87 |
| 9 | 65.6 | 85.07 | 35.95 | 32.30 | 41.60 | 34.22 |
| 24 | 68.9 | 94.03 | 45.41 | 46.32 | 47.88 | 43.82 |

In Table 1, the spraying operations corresponding to the listed measurements were performed at approximately the indicated times. For a given time, the solid content represents the net weight of paint cured in a cup divided by the net weight of paint sprayed into the cup (with the quotient being multiplied by 100). The weight average ("Wt. Avg." of second column) represents solids content of the paint after curing. It is noted that when the paint is not in proper suspension or the closed loop system has a leak that allows the solvent to flash off, there will be an increase in the solids content since the painting device will not be spraying as much solvent (e.g., solvent separates to the top of the cartridge and when sprayed from the bottom of the cartridge, more solids will be sprayed than solvent). Thus, during the curing process, there will be less solvent to flash off, thereby leaving a higher solid content. A similar result can occur if the solvent vapor leaves the painting system, even if there is proper suspension, since not as much solvent is present in the mixture. For each of the two samples in Table 1, the frame thickness refers to the cured paint layer thickness at the perimeter of a test panel resulting from two passes; and the flood thickness refers to the cured paint layer thickness at a mid-portion of the test panel resulting from two passes. The two sample measurements were obtained at two locations within the sprayed panel.

Figure 9A:
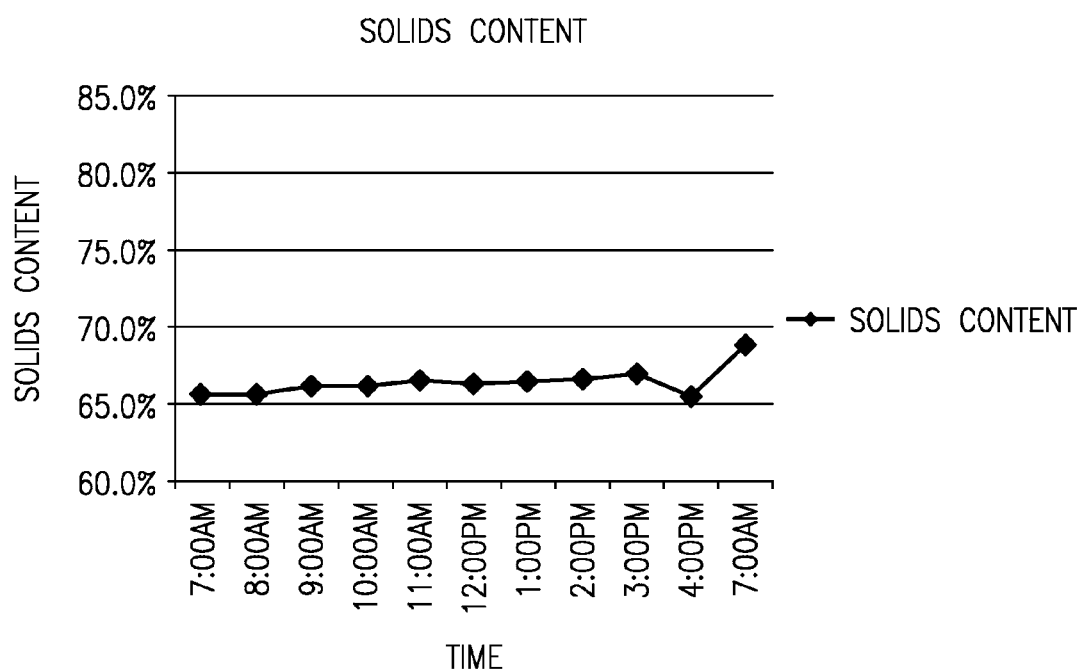
FIGS. 9A and 9B show examples of the suspension properties and resulting painted-layer quality during the operating period of FIGS. 8A-8C.

FIG. 9A shows a plot of the solid content measurements listed in Table 1. One can see that the solid content values are relative uniform (with a slight overall increasing trend) over the initial 9 hours when the hourly spray operations are performed. At the end of the 24-hour period, the solid content is shown to increase slightly. However, it is noted that the overall uniformity is significantly improved over painting configurations without the peristalsis-based agitation.

Figure 9B:
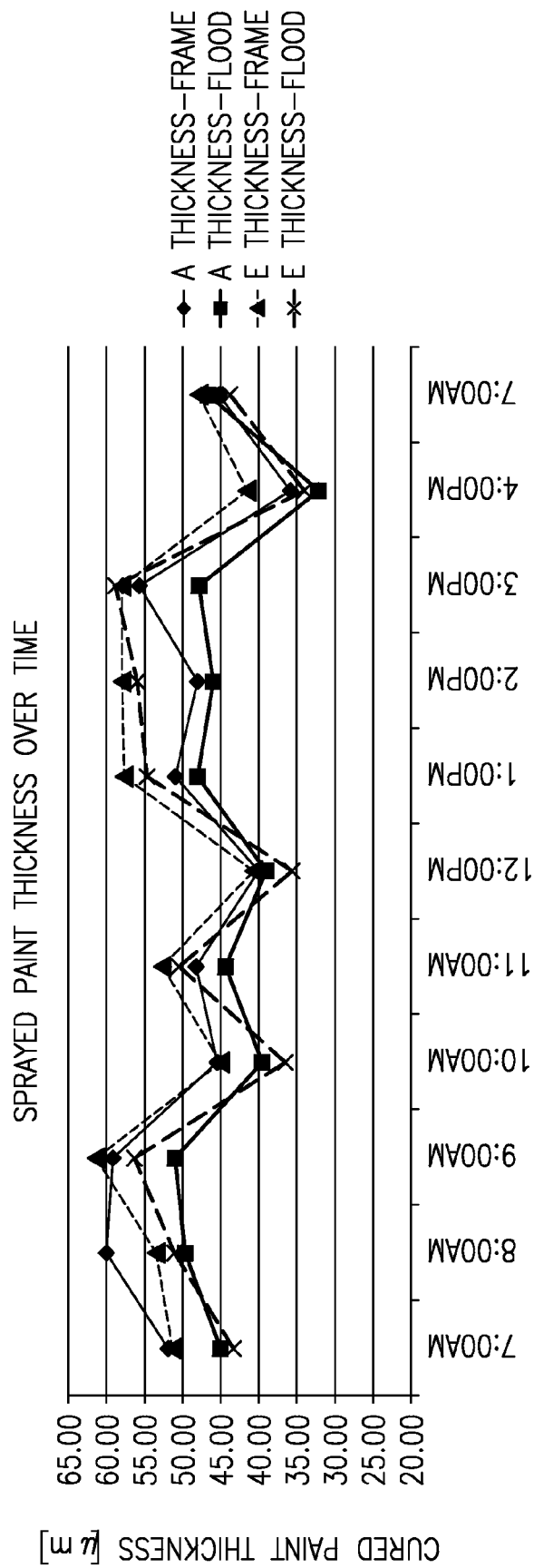

FIG. 9B shows plots of the various painted layer thickness measurements listed in Table 1. One can see that the thicknesses in general show a slight overall decreasing trend; however, it is also noted that the overall uniformity is significantly improved over painting configurations without the peristalsis-based agitation.

As described herein, a spray apparatus (e.g., 106 in FIGS. 4-6) can receive metallic paint from a reservoir (102) for spraying, and if not spraying, for recirculation via a recirculator (114). FIGS. 10-17 show various examples of how such a spray apparatus can be configured to provide desired spraying performance and/or to facilitate maintaining of a desired paint suspension level.

Figure 10:
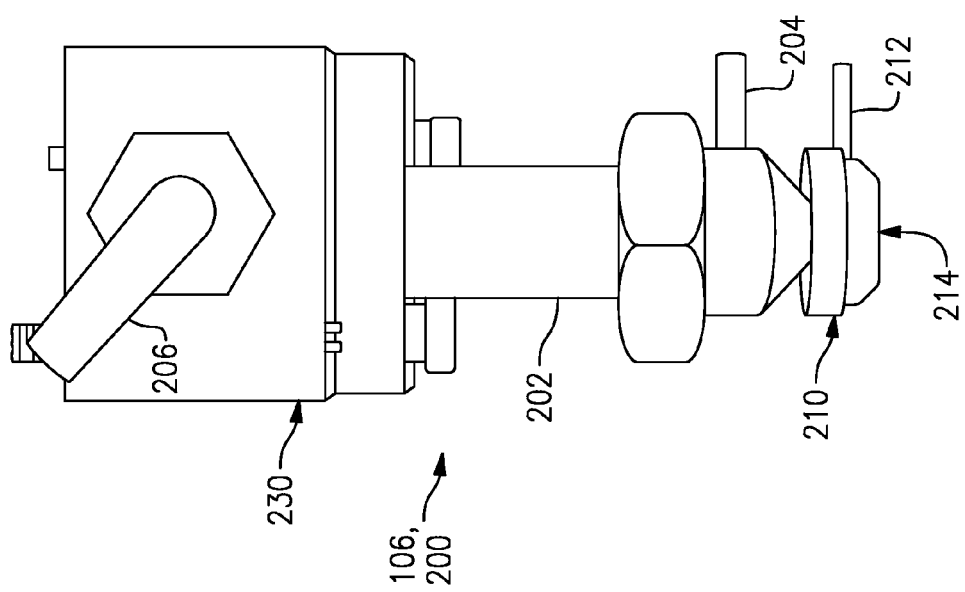
FIG. 10 shows an example of the spray apparatus of FIG. 4.

FIG. 10 shows an example configuration of a spray apparatus (106, and also referred to herein as 200), and FIG. 12 schematically depicts the same spray apparatus 200. The spray apparatus 200 is shown to include a paint chamber 202 that defines a chamber volume 208. Paint from, for example, a reservoir (not shown) can enter (arrow 146) the chamber 202 through an input tubing 144 and an input fitting 204. Paint can exit (arrow 150) the chamber 202 through a return fitting 206 and a return tubing (e.g., 130a in FIG. 5) to, for example, a recirculator (not shown).

The spray apparatus 200 is shown to further include a spray nozzle assembly 210 configured to provide a spray output through a nozzle 214. Such a spray output can be atomized by, for example, a pressurized gas entering the nozzle assembly 210 through a tubing 216 and a fitting 212.

The spray apparatus 200 can further include an assembly 230 (shown in FIG. 10, but not in FIG. 12) configured to hold a seal and a return mechanism for a seat valve pin that allows the paint to be sprayed or recirculated. Additional details concerning the assembly 230 and related functionalities are described herein in reference to FIGS. 17A-17E. The foregoing seal can be configured to prevent leakage of paint out of the top portion of the chamber 202. In some embodiments, the sealing portion of the assembly 230 can form an upper cap for the chamber 202. As described herein, actions of the seat valve pin can allow the paint to come out of the chamber for spraying (through the nozzle assembly 210) or for recirculating (through the fitting 206). Thus, the assembly 230 and the seat valve pin can facilitate switching between a recirculation mode to agitate the paint and a spray mode to spray the paint from the chamber 202.

In the example configuration 200 of FIGS. 10 and 12, the volume 208 of the chamber 202 can be relatively large, and the return 206 can be spaced vertically from the input 204 by a relatively large distance. In some situations, one or both of such features can increase the likelihood of metal flakes settling in the chamber 202. In some situations, such settling of metal flakes can occur relatively rapidly.

As described herein, when the metal flakes are not in proper suspension, spraying properties can be impacted significantly, and/or the spray apparatus can become clogged due to build-up of metal flakes. In terms of the resulting painted layers, the foregoing problems can yield uneven paint thickness and negatively impact the reliability of such layers. Additionally, a relatively large chamber volume can require significantly more paint to purge. In situations where the paint (e.g., metallic paint) is expensive, such a purging requirement can be very costly.

Figure 11:
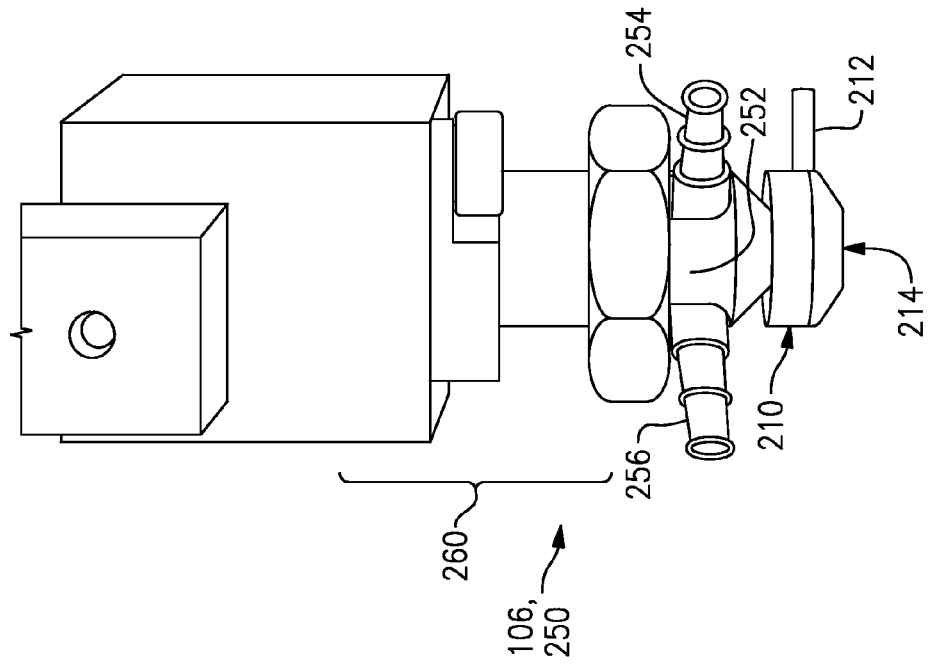
FIG. 11 shows another example of the spray apparatus of FIG. 4.

FIGS. 11 and 13 show that in some embodiments, a spray apparatus (106, and also referred to herein as 250) can be implemented, and such a configuration can address some or all of the foregoing challenges associated with the example of FIGS. 10 and 12. FIG. 13A schematically depicts a side view of the spray apparatus 250 of FIG. 11; and FIG. 13B schematically depicts a plan view of the same spray apparatus.

The spray apparatus 250 is shown to include a paint chamber 252 that defines a chamber volume 258. Paint from, for example, a reservoir (not shown) can enter (arrow 146) the chamber 252 through an input tubing 144 and an input fitting 254. Paint can exit (arrow 150) the chamber 252 through a return fitting 256 and a return tubing (e.g., 130a in FIG. 5) to, for example, a recirculator (not shown).

The spray apparatus 250 is shown to further include a spray nozzle assembly 210 configured to provide a spray output through a nozzle (e.g., 214 in FIG. 11). Such a spray output can be facilitated by, for example, a pressurized gas entering the nozzle assembly 210 through a tubing 216 and a fitting 212. In some embodiments, the nozzle assembly 210 can be similar to that described in reference to FIGS. 10 and 12.

The spray apparatus 250 can further include an assembly 260 (shown in FIGS. 11 and 13A) configured to hold a seal (331 in FIG. 13A) and a return mechanism for a seat valve pin (320 in FIG. 13A) that allows the paint to be sprayed or recirculated. Additional details concerning the assembly 260 and related functionalities are described herein in reference to FIGS. 17A-17E. The foregoing seal 331 can be configured to prevent leakage of paint out of the top portion of the chamber 252. In some embodiments, the assembly 260 can include a lower portion that is configured to form an upper portion of the chamber 252, and to attach the chamber 252 to a support structure for the peristaltic pump as described herein. As described herein, actions of the seat valve pin 320 can allow the paint to come out of the chamber for spraying (through the nozzle assembly 210) or for recirculating (through the fitting 256). Thus, the assembly 260 and the seat valve pin 320 can facilitate switching between a recirculation mode to agitate the paint and a spray mode to spray the paint from the chamber 252.

In the example configuration 250 of FIGS. 11 and 13, the volume 258 of the chamber 252 can be relatively small, and the return 256 can be positioned at approximately the same height as the input 254 (in the side view of FIG. 13A). In some situations, one or both of such features can reduce the likelihood of metal flakes settling in the chamber 252. As described herein, such settling of metal flakes can occur relatively rapidly.

Accordingly, metal flakes can remain in proper suspension in the chamber 252, thereby maintaining desirable spraying properties. In terms of the resulting painted layers, the foregoing features can yield improvements in uniformity of paint thickness and thereby the reliability of such layers. Additionally, such a relatively small chamber volume can require significantly less paint to purge. In situations where the paint (e.g., metallic paint) is expensive, such a reduced purging volume requirement can reduce costs associated with spray-painting processes.

The plan view of the configuration in FIG. 13B (where the assembly 260 and the seat valve pin 320 are now shown) shows an example configuration where input and return fittings 254, 256 are arranged so as to form an angle θ with each other. Such an angle can be adjusted to a value (e.g., less than 180 degrees, approximately 180 degrees, or greater than 180 degrees) to, for example, accommodate tubing connections that are as short as possible with the paint reservoir and/or the recirculator. In some embodiments, the angle θ between the input 254 and the return 256 can be selected to reduce or minimize turbulence in the volume 258 of the chamber 252. For example, the angle θ can be in a range between 30 and 150 degrees, 45 and 135 degrees, 60 and 120 degrees, or 80 and 100 degrees. In some embodiments, the angle θ can be approximately 90 degrees, where it was observed to yield a desirable flow rate through the chamber 252 to thereby improve the recirculation rate to keep the paint properly mixed, and reduce the likelihood of conglomeration of the metal particles (e.g., silver flake) in the chamber 252.

Figure 14A:
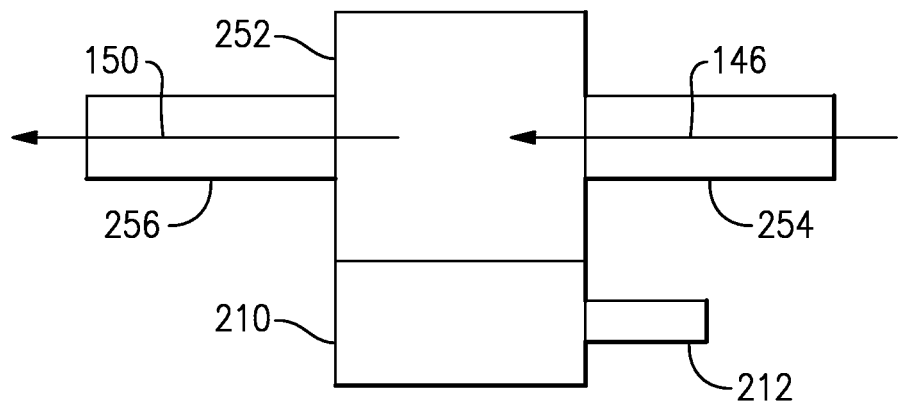
FIGS. 14A and 14B schematically depict how the spray apparatus of FIGS. 11 and 13 can operate in a recirculate mode and a spray mode.
Figure 14B:
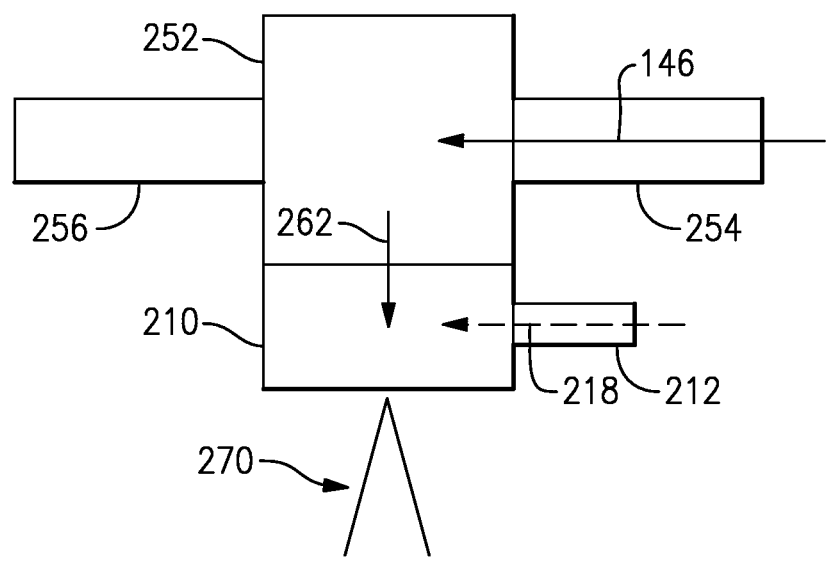

As described in reference to FIGS. 11 and 13, the spray assembly 250 can be configured to be able to facilitate recirculate and spray modes. FIG. 14A schematically depicts a recirculate mode that can be facilitated by the spray assembly 250. FIG. 14B depicts a spray mode that can be facilitated by the spray assembly 250. Examples of how such recirculate and spray modes can be facilitated by the spray assembly 250 are described herein in reference to FIGS. 17A-17E.

In the recirculate mode, the input paint can enter (arrow 146) the chamber 252 through the input fitting 254, and be directed out (arrow 150) of the chamber 252 through the return fitting 256 so as to allow the paint to be returned to a reservoir. In some embodiments, such a return of paint can be facilitated by operation of a recirculating pump (e.g., a peristaltic pump) as described herein, and such a return configuration can allow the paint to be agitated in a desirable manner.

In some embodiments, a passageway between the chamber 252 and the nozzle assembly 210 can be blocked substantially completely when the spray assembly 250 is in the recirculate mode. An example of such blocking is described herein in reference to FIGS. 17A-17E.

In the spray mode, the input paint can enter (arrow 146) the chamber 252 through the input fitting 254, and be directed out (arrow 262) of the chamber 252 to the nozzle assembly 210 so as to facilitate the spray mode. In some embodiments, passage of paint out of the chamber 252 through the return 256 can be inhibited by shutting off the recirculating pump (e.g., the peristaltic pump) when in the spray mode. The recirculating pump being off while in the spray mode can also avoid pulsing effects of the pump (e.g., resulting from peristalsis action) impacting the spray output. The passageway between the chamber 252 and the nozzle assembly 210 can be opened when the spray assembly 250 is in the spray mode. An example of such opening of the passageway is described herein in reference to FIGS. 17A-17E. The paint provided to the nozzle assembly 210 can be forced out from the chamber 252 by the pressure of the input paint (146). In some embodiments, a spray pattern 270 can be obtained by an atomizer supplied with a pressurized gas 218 provided through the fitting 212. An example of such an atomizer is described herein in reference to FIG. 17A.

In some embodiments, switching between spray and recirculate modes can be implemented so that a number of components in the painting system (e.g., 100 in FIG. 4) are controlled in a coordinated manner. For example, a spray mode can include the recirculation pump being shut off to prevent recirculation and to avoid pulsing effects during spraying. Also, the foregoing opening of the passageway between the chamber 252 and the nozzle assembly 210 (in FIG. 14B) can be effectuated (as described by example in FIGS. 17A-17E) by providing compressed air to an actuation mechanism (e.g., 338 in FIG. 17A).

Figure 17A:
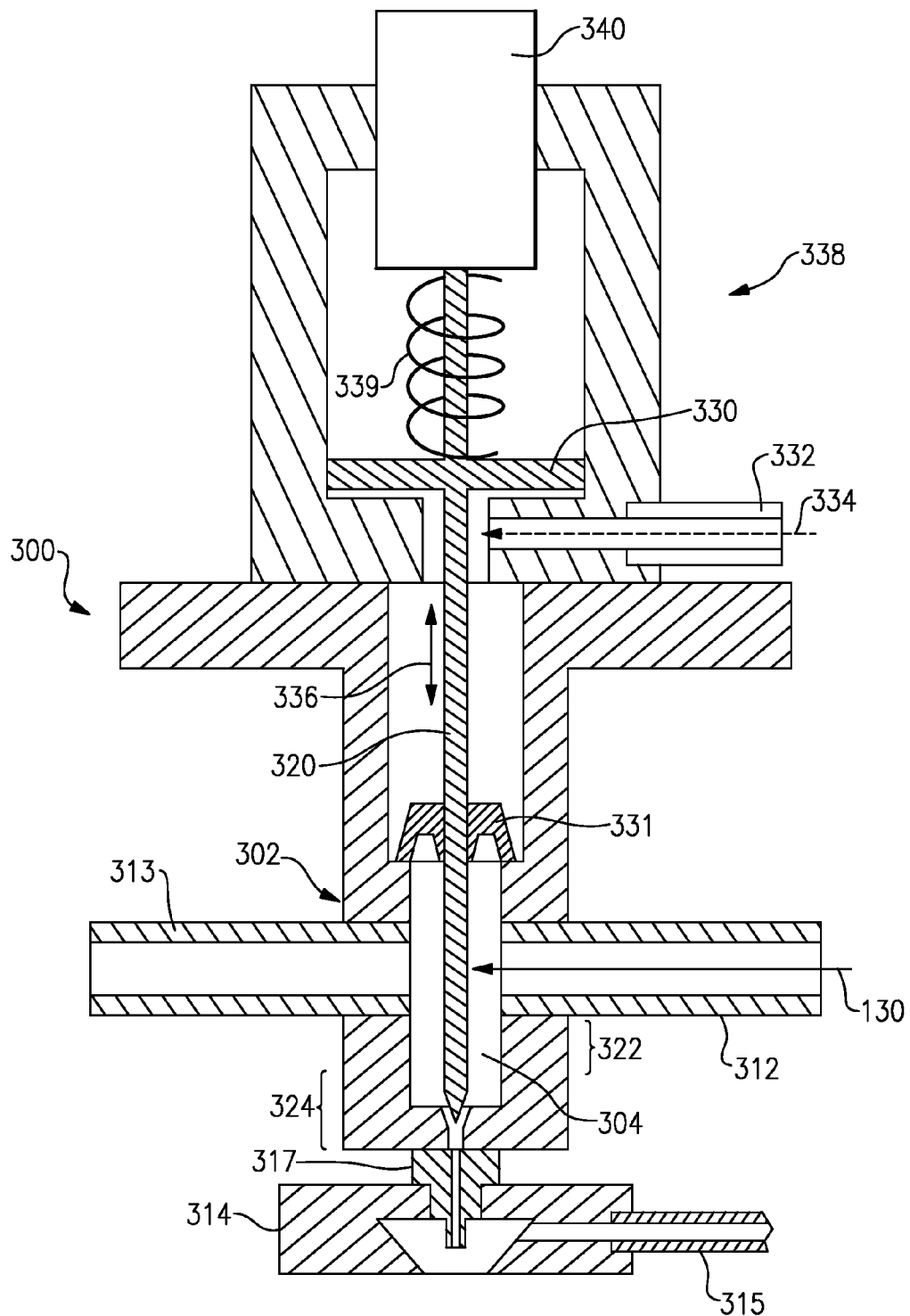
FIGS. 17A-17E show various examples of a paint chamber of a spray head, and how such a spray head can be configured to switch between a spray mode and a recirculate mode.

In an example of a recirculate mode, the foregoing passageway between the chamber 252 and the nozzle assembly 210 (in FIG. 14B) can be closed (as described by example in FIGS. 17A-17E) by shutting off the compressed air to the actuation mechanism (338 in FIG. 17A). Also, the circulation pump can be turned on to allow recirculation of the paint as described herein.

In some embodiments, and as depicted in FIG. 4, some or all of the switching functionalities and/or other functionalities associated with the painting system can be coordinated by a controller 400. In some embodiments, such a controller can cooperate with one or more other controllers associated with production components upstream and/or downstream of the painting system.

Figure 15:
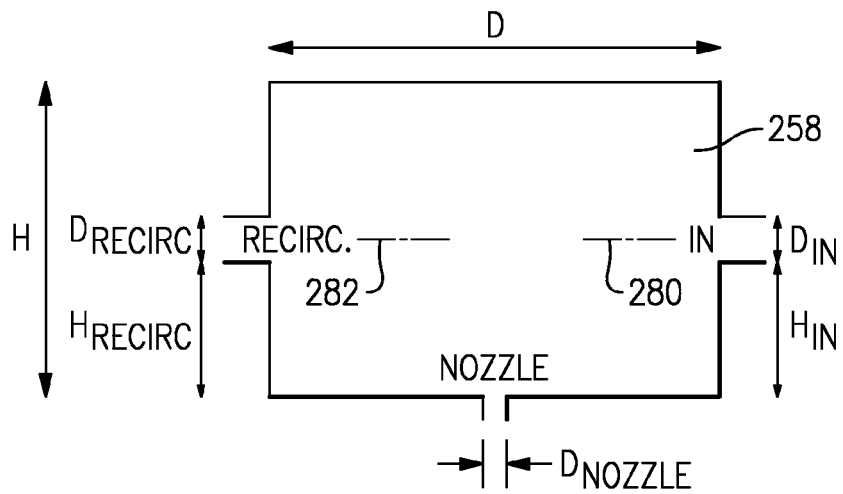
FIG. 15 schematically depicts an example of how an input and a recirculating-output of the spray apparatus of FIGS. 11, 13 and 14 can be configured.

FIG. 15 shows that in some embodiments, the spray assembly 250 as described herein can be implemented so that its chamber volume 258 is dimensioned to facilitate maintaining of proper paint suspension. In the context of an example cylindrical shape, suppose that the volume 258 has a diameter D and a height H. A passageway into the volume 258 is shown to be positioned at a height $h_{in}$ and have a diameter $d_{in}$. A passageway out of the volume 258 to a recirculator is shown to be positioned at a height $h_{recirc}$ and have a diameter $d_{recirc}$. A passageway out of the volume 258 to a nozzle assembly (210) is shown to be positioned at a bottom surface of the volume 258 and have a diameter $d_{nozzle}$. In some implementations, some or all of the foregoing design parameters can be selected to achieve one or more desired paint suspension properties and/or spraying performance.

In the example shown, the heights (depicted by lines 280 and 282) of the input and return passageways can be generally the same. Because of the approximately same height of the input and return passageways, the vertical dimension H of the volume 258 can be reduced or minimized. Such a reduced dimension can provide a number of advantages, including but not limited to, reduced purge volume, a flow of paint that is more laminar between the input and return passageways, and simpler selector designs that have less or no sharp features (such as screw threads) where paint particles tend to accumulate.

Figure 16A:
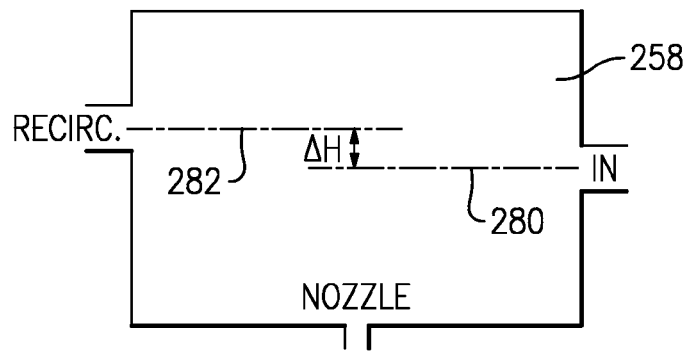
FIGS. 16A and 16B show non-limiting examples of how the input/recirculating-output arrangement can be modified.
Figure 16B:
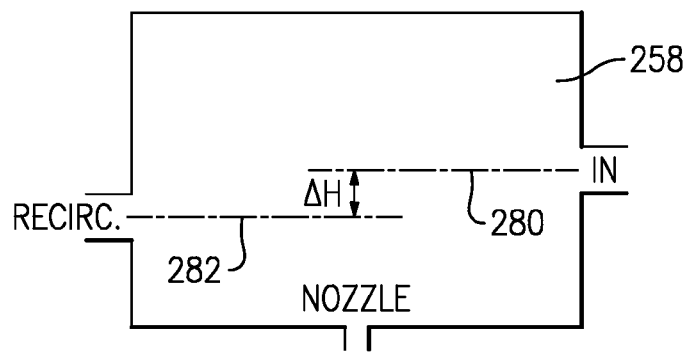

In some implementations, the foregoing same-height (of input and return passageways) feature can be modified to accommodate some other design considerations. As shown in FIGS. 16A and 16B, such heights can be different, and the spray assembly 250 can retain some or all of the desirable features described herein. For example, FIG. 16A shows that the recirculating output's height 282 can be higher than the input's height 280 by an amount Δh. In another example, FIG. 16A shows that the recirculating output's height 282 can be lower than the input's height 280 by an amount Δh.

Figure 17B:
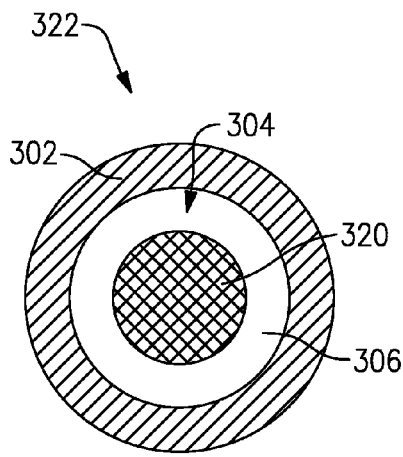
Figure 17C:
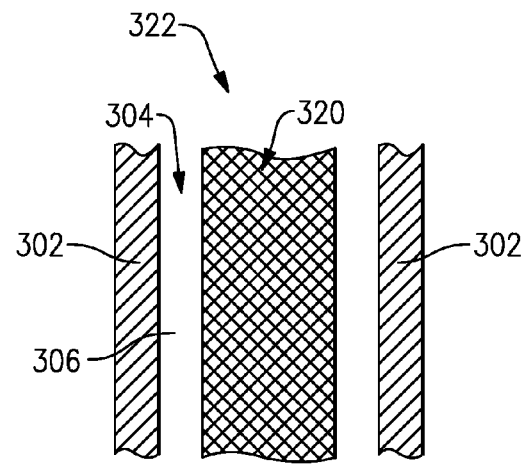
Figure 17D:
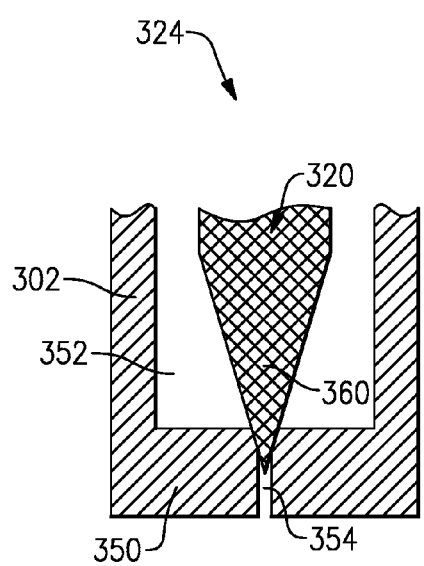
Figure 17E:
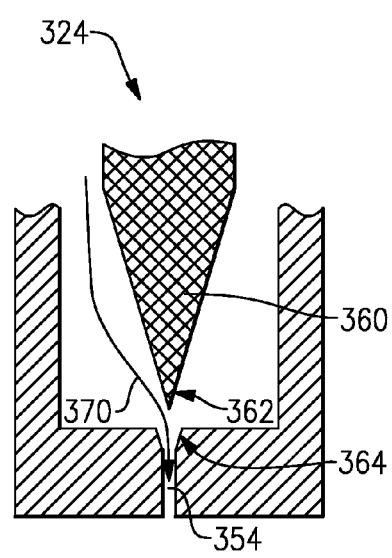

As described herein in reference to FIGS. 10-14, a spray assembly (e.g., 200 in FIGS. 10 and 12, or 250 in FIGS. 11 and 13) can be configured to be in a spray mode or a recirculate mode. FIGS. 17A-17E show various views of an example mechanism that can be implemented to facilitate such modes and to allow switching between such modes. FIG. 17A schematically depicts a cutaway view of a spray assembly 300 having a mechanism for achieving the foregoing functionalities. FIG. 17B shows a sectional view of a portion 322 of a paint chamber 302 of the spray assembly 300. FIG. 17C shows a side sectional view of the same portion 322. FIG. 17D shows a more detailed view of a portion 324 when the spray assembly 300 is in the recirculate mode. FIG. 17E shows a more detailed view of the same portion 324 when the spray assembly 300 is in the spray mode.

The example configuration shown in FIG. 17A is depicted in the context of the examples described herein in reference to FIGS. 11, 13 and 14. It will be understood, however, that one or more features associated with the spray assembly 300 can also be implemented in other configurations (e.g., examples of FIGS. 10 and 12).

The example configuration of FIG. 17A does not include a heating portion between a paint input and the portion 324. In some embodiments, such a heating portion can be included in situations where heating of the material being sprayed improves the spraying characteristics. Thus, it will be understood that such a heating portion may or may not be included in various embodiments of the spray assembly as described herein. The example configurations described in reference to FIGS. 10-13 do not have such a heating portion.

In the example configuration 300, the chamber 302 is shown to define a volume 304 dimensioned to allow a valve pin 320 (also referred to herein as a needle) to move up (e.g., in the spray mode) and down (e.g., in the recirculate mode). Such a switching action can allow paint (depicted as an arrow 310) to flow from an input 312 to a paint output (in the portion 324) in the spray mode, or to a recirculation output 313 in the recirculate mode. In some embodiments (e.g., the examples of FIGS. 10-13), the input fitting 312 can be coupled directly with the interior of the chamber 302 without an intervening input manifold. Similarly, the recirculation output fitting 313 can be coupled directly with the interior of the chamber 302 without an intervening output manifold.

Within the chamber 302, the paint can move from the input fitting 312 to the paint output area through a conduit 306 (see FIGS. 17B and 17C) defined in the volume 304 between the wall of the chamber 302 and the valve pin 320. The sectional area of the conduit defined by the wall of the chamber 302 and the valve pin 320 (depicted as 306 in FIGS. 17B and 17C) can be selected to achieve desired functionalities such as paint flow and/or purge volume. Such a selection of the sectional area can be facilitated by, for example, providing different diameters of the valve pin 320 and/or the volume 304 of the chamber 302.

FIGS. 17D and 17E schematically depict the paint output of the portion 324. The chamber 302 is shown to include an end cap 350 so as to define an end space 352. The end cap 350 can define or include a spray aperture 354 dimensioned to allow passage of the paint from the end space 352 to a nozzle 317 and an atomizer 314 (shown in FIG. 17A) when opened (FIG. 17E). When the spray aperture 354 is closed (FIG. 17D), the paint can be retained in the end space 352 before being pumped out for recirculation.

In some embodiment, the foregoing movement of paint through the spray aperture 354 (e.g., when in the spray mode) can be facilitated by the paint pressure provided from the reservoir (e.g., 102 in FIG. 6) which is in turn provided by compressed air through the tube 142 (FIG. 6). During such a spray mode, the recirculation pump 120 (e.g., in FIG. 6) is preferably turned off to avoid pulsating spray output through the aperture 354. In some embodiments, the atomizer 314 can be a coaxial air based atomizer operated by pressurized air through an input 315.

The spray aperture 354 is shown to include a valve seat 364 dimensioned to mate with a tip 360 of the valve pin 320. In the closed configuration (recirculate mode) of FIG. 17D, the surface of the valve tip 360 can mate with the corresponding surface of the valve seat 364 to substantially seal the spray aperture 354. In the open configuration (spray mode) of FIG. 17E, the valve tip 360 can be retracted away from the valve seat 364 so as to allow flow of paint (arrow 370) from the end space 352 through the spray aperture 354. Although described in the context of a pointed tip shape of the valve pin 320 and the corresponding valve seat shape, it will be understood that other valve and seat shapes can also be utilized.

As shown in FIG. 17A, the foregoing seating and retraction of the valve pin 320 can be actuated by an air piston 330 that is coupled to the valve pin 320. In the example shown, a return spring assembly 338 can be configured to push the valve pin 320 into its seated position to yield the recirculate mode. To retract the valve pin 320 to thereby actuate the spray mode, pressurized air (arrow 334) can be provided to the air piston 330 through an air inlet 332. The pressurized air can then push up on the air piston 330 to retract the valve pin 320 to allow the paint to pass through the spray aperture 354. To seat the valve pin 320 to thereby stop the spraying, the pressurized air (334) can be turned off, and a spring 339 can push down on the piston 330, and thus the valve pin 320.

The foregoing up and down movements of the valve pin 320 are indicated by an arrow 336. Such movements of the valve pin 320 are preferably achieved while keeping the paint within the chamber 302 and away from the spring assembly 338 and the related actuation mechanisms. In some embodiments, a seal 331 can be provided and configured to inhibit such leakage of paint upward from the chamber 302. In some embodiments, the seal 331 can be, for example, a U-cup seal mounted in an inverted manner as shown, with the valve pin extending through its center portion. Such a seal can be configured to maintain or increase its sealing property when pressure (e.g., paint pressure from the chamber 302) is provided.

In the example shown in FIG. 17A, an adjustment device 340 can be provided and configured to, for example, allow adjustment of retraction travel of the valve pin 320 when actuated by the air piston. In some embodiments, such an adjustment device can be configured to provide fine microadjustment capability.

In some embodiments, various features associated with the foregoing switching functionality between recirculate and spray modes as described in reference to FIGS. 17A-17E can be implemented in any of the example spray apparatus described herein in reference to FIGS. 4-16 or any combination thereof. In some embodiments, the coaxial air based atomizer can also be utilized in the same spray apparatus.

As described herein, one or more features of the present disclosure can provide a number of advantageous features for spraying and/or recirculation of metallic paint in applications such as formation of metallic paint layers on panels having radio-frequency modules. For example, a desired suspension of metallic particles in solution can be achieved quickly and maintained for an extended period of time. In another example, a spray apparatus and its coupling with a recirculator and a paint reservoir can be configured to reduce the purge volume by, for example, a reduced paint chamber volume and reduced pathlengths between the coupled components. In yet another example, the spray apparatus can be configured to reduce the likelihood of paint particles accumulating within the paint chamber volume, as well as its input and output(s).

The foregoing examples of issues associated with painting applications and the various features that can address such issues can become much more pronounced in high-throughput mass production settings. For example, negative effects in production volume, yield and quality resulting from disruptions and stoppages associated with conventional painting systems not having the advantageous features as described herein can be substantial. Further, inefficient use of expensive materials such as metallic paint can result from such conventional painting systems not having the advantageous features as described herein can also be substantial.

In the context of high-throughput mass production settings, if a conventional painting system is in series with other processing systems (upstream and/or downstream), such processing systems will likely need to be suspended during cleaning and/or maintenance of the painting system (e.g., to clean out accumulated paint resulting in clogged paths and parts), thereby significantly interrupting the production volume. Even if a number of such painting systems are provided in parallel, the overall maintenance/cleaning frequency simply increases, typically requiring increased time and resource of operators.

As described herein, need for and frequency of such cleaning and/or maintenance can be reduced significantly, and in some situations, may be eliminated. For example, a painting system can be configured to provide and maintain a desired paint particle suspension level over a 12-hour period. It is also possible that such a period between maintenance can be extended beyond 12 hours.

Aside from the advantages associated with reduced frequency of cleaning and/or cleaning, improved consistency in the quality of painted layers can be realized. Such consistency, resulting from one or more features as described herein, translates into significantly improved yield and quality of the modules manufactured in mass quantities.

In some embodiments, one or more features as described herein can be implemented during manufacture of packaged electronic modules, including radio-frequency (RF) modules such as a power amplifier (PA) module, a low noise amplifier (LNA) module, a switching module, a front-end module, a global positioning system (GPS) module, a controller module, an application processor module, an audio module, a display interface module, a memory module, a digital baseband processor module, an accelerometer module, a power management module, a transceiver module, or a module configured to provide one or more functionalities associated with such modules.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation (s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A painting system for fabricating electronic modules, the system comprising:

a reservoir having an input and an output, the reservoir implemented to hold a volume of metallic paint;

a recirculator coupled to the reservoir and implemented to receive metallic paint that has left the output of the reservoir and pump the metallic paint back to the input of the reservoir by peristalsis action to agitate the volume of metallic paint in the reservoir; and a spray apparatus implemented between the output of the reservoir and the recirculator, the spray apparatus including a selector configured to route the metallic paint to either a nozzle assembly of the spray apparatus or the recirculator for pumping the metallic paint back to the reservoir, a chamber that defines an input port implemented to receive the metallic paint from the reservoir, and a return port implemented to allow return of the metallic paint back to the reservoir, the input port and the return port located at one or more vertical walls of the chamber, and an azimuthal angle between the input port and the return port is in a range between 30 and 150 degrees.

2. The painting system of claim 1 wherein the nozzle assembly is configured to be capable of spraying the metallic paint.

3. The painting system of claim 2 wherein the recirculator includes a peristaltic pump.

4. The painting system of claim 3 wherein the peristaltic pump is a rotary-type peristaltic pump.

5. The painting system of claim 4 wherein the peristaltic pump is configured to operate at different speeds to yield different flow rates.

6. The painting system of claim 5 wherein a size of the peristaltic pump allows the spray apparatus and the reservoir to be positioned adjacent to the peristaltic pump, thereby allowing a reduction in a length for the recirculating path.

7. The painting system of claim 5 wherein each of the path from the spray apparatus to the peristaltic pump and the path from the peristaltic pump to the reservoir includes a tubing having a bore diameter selected to yield a desired flow rate of the recirculating path.

8. The painting system of claim 7 wherein an increase in the bore diameter results in an increase in the flow rate.

9. The painting system of claim 5 wherein the reservoir further includes a gas input configured to receive a pressurized gas to push the metallic paint from the reservoir to the spray apparatus.

10. The painting system of claim 3 wherein a recirculating path defined by a path from the reservoir to the spray apparatus, a path from the spray apparatus to the peristaltic pump, and a path from the peristaltic pump to the reservoir, is substantially closed to inhibit vaporization loss.

11. The painting system of claim 10 wherein the recirculating path has a length that is less than approximately 30 inches to reduce a purging volume.

12. The painting system of claim 11 wherein the length is less than approximately 15 inches.

13. The painting system of claim 1 wherein the selector includes a seal mechanism.

14. The painting system of claim 1 wherein the system is capable of establishing a desired level of suspension for the metallic paint from a separated state within approximately 5 minutes.

15. The painting system of claim 14 wherein the system is capable of substantially maintaining the desired level of suspension for at least 9 hours.

16. The painting system of claim 15 wherein the system is capable of substantially maintaining the desired level of suspension for at least 12 hours.

* * * * *